(12) United States Patent
You et al.

(10) Patent No.: US 11,696,469 B2
(45) Date of Patent: Jul. 4, 2023

(54) ELECTRONIC DEVICE

(71) Applicant: Samsung Display Co., Ltd., Yongin-si (KR)

(72) Inventors: Ri-Na You, Cheonan-si (KR); Sungchul Kim, Busan (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 524 days.

(21) Appl. No.: 16/778,485

(22) Filed: Jan. 31, 2020

(65) Prior Publication Data
US 2020/0273934 A1 Aug. 27, 2020

(30) Foreign Application Priority Data

Feb. 26, 2019 (KR) .................. 10-2019-0022605

(51) Int. Cl.
*H10K 50/86* (2023.01)
*H10K 50/844* (2023.01)
*H10K 50/842* (2023.01)

(52) U.S. Cl.
CPC ........... *H10K 50/86* (2023.02); *H10K 50/844* (2023.02); *H10K 50/8426* (2023.02); *H10K 50/865* (2023.02)

(58) Field of Classification Search
CPC ............ H01L 27/3225; H01L 27/3234; H04M 1/0264; H04M 1/0266; G06F 1/1684–1688; G06F 1/1694; H10K 50/86–868
See application file for complete search history.

(56) References Cited

U.S. PATENT DOCUMENTS

| | | | |
|---|---|---|---|
| 10,009,525 B2 | 6/2018 | Mathew et al. | |
| 10,018,891 B2 | 7/2018 | Weber | |
| 2017/0187934 A1* | 6/2017 | Kwak | G02F 1/1333 |
| 2017/0287992 A1 | 10/2017 | Kwak et al. | |
| 2018/0146564 A1 | 5/2018 | Wang et al. | |
| 2018/0198067 A1 | 7/2018 | Kim et al. | |
| 2022/0263054 A1* | 8/2022 | Shim | H01L 51/524 |

FOREIGN PATENT DOCUMENTS

| | | | |
|---|---|---|---|
| KR | 10-1202577 | 11/2012 | |
| KR | 10-2014-0105149 | 9/2014 | |
| KR | 10-1627058 | 6/2016 | |
| KR | 10-2017-0077067 | 7/2017 | |
| KR | 10-2017-0111827 | 10/2017 | |
| KR | 10-2018-0057821 | 5/2018 | |
| KR | 10-2018-0083459 | 7/2018 | |
| WO | WO-2019240331 A1 * | 12/2019 | G02F 1/133308 |

* cited by examiner

*Primary Examiner* — Mariceli Santiago
(74) *Attorney, Agent, or Firm* — F. Chau & Associates, LLC

(57) ABSTRACT

An electronic device that includes a display module having an active area that includes at least one pixel and a module hole and a non-active area adjacent to the active area that does not include a pixel. A window is disposed on the display module. A functional layer is disposed between the display module and the window. The functional layer includes a first opening defined therethrough that overlaps with the module hole. A light blocking layer is disposed on at least one of upper and lower surfaces of the functional layer and is positioned adjacent to the first opening. An electronic module is disposed in an opening formed by at least one of the module hole and the first opening.

17 Claims, 15 Drawing Sheets

ELECTRONIC DEVICE

CROSS-REFERENCE TO RELATED APPLICATION

This application claims priority under 35 U.S.C. § 119 to Korean Patent Application No. 10-2019-0022605, filed on Feb. 26, 2019, in the Korean Intellectual Property Office, the disclosure of which is incorporated by reference in its entirety herein.

TECHNICAL FIELD

The present disclosure relates to an electronic device. More particularly, the present disclosure relates to an electronic device that prevents light leakage from occurring.

DISCUSSION OF RELATED ART

Portable electronic devices have become very popular in recent years and provide an increasingly diverse array of functions. Many users prefer electronic devices that have a relatively wider display area and a relatively narrower bezel area.

Various types of electronic devices have been developed to reduce the bezel areas. For example, some electronic devices omit the bezel area. These devices may include a camera and a sensor which both overlap with the display area. The camera and sensor which overlap with the display area may be disposed in a hole provided in the device. However, these electronic devices frequently experience light leakage from regions around the hole which results in a decrease in the display quality.

SUMMARY

The present disclosure provides an electronic device capable of preventing a light leakage from occurring around a hole defined in a display area.

Exemplary embodiments of the present inventive concepts provide an electronic device that includes a display module having an active area and a non-active area adjacent to the active area. Pixels are disposed in the active area and are not disposed in the non-active area. The active area includes a module hole. A window is disposed on the display module. A functional layer is disposed between the display module and the window. The functional layer includes a first opening defined therethrough that overlaps with the module hole. A light blocking layer is disposed on at least one of upper and lower surfaces of the functional layer and is positioned adjacent to the first opening. An electronic module is disposed in an opening formed by at least one of the module hole and the first opening.

Exemplary embodiments of the present inventive concepts further provide an electronic device that includes a display module having an active area and a non-active area adjacent to the active area. Pixels are disposed in the active area and are not disposed in the non-active area. The active area includes a module hole. A window is disposed on the display module. A window black matrix is disposed on an upper surface or a lower surface of a peripheral area of the window. The peripheral area overlaps a region of the display module adjacent to the module hole. A light blocking layer is disposed between the display module and the window black matrix. An electronic module is disposed in an opening formed by the module hole.

Exemplary embodiments of the present inventive concepts also provide an electronic device that includes a display module having an active area and a non-active area adjacent to the active area Pixels are disposed in the active area and are not disposed in the non-active area. The active area includes a module hole. An electronic module is disposed in an opening formed by the module hole. A window is disposed on the display module. The active area comprises a first area defined adjacent to the module hole and a second area surrounding the first area. The at least one pixel is not disposed in the first area, and the at least one pixel is disposed in the second area. The display module includes a lower display substrate comprising a base layer, a circuit device layer, and a display device layer. An encapsulation substrate faces the lower display substrate. A light blocking sealing member is configured to couple the lower display substrate and the encapsulation substrate in the first area and comprises a light blocking material.

According to the exemplary embodiments, since the light blocking layer is formed in the functional layer interposed between the window and the display module to overlap the peripheral area of the module hole, a light leakage phenomenon in which the light leaked from the peripheral area of the module hole is viewed from the outside by the user may be prevented.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF THE EXEMPLARY EMBODIMENTS

Figure 1A:
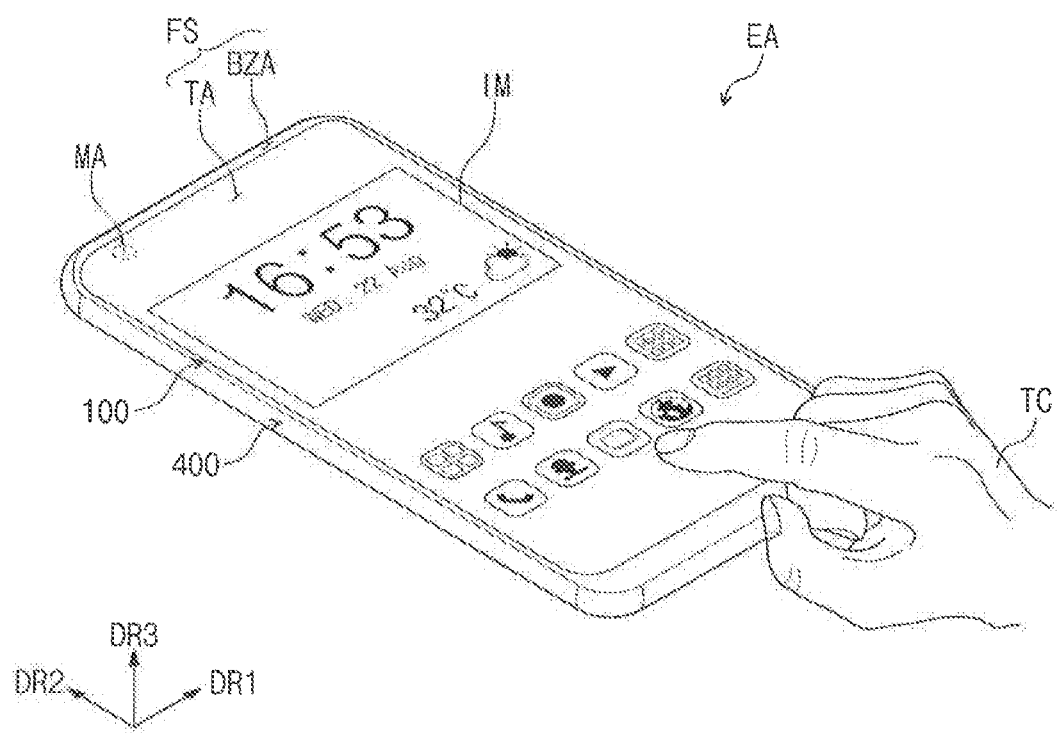
FIG. 1A is a perspective view showing an electronic device according to an exemplary embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Therefore, a first element, component, region, layer or section discussed below could be described as a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe the relationship of one element or feature to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 1B:
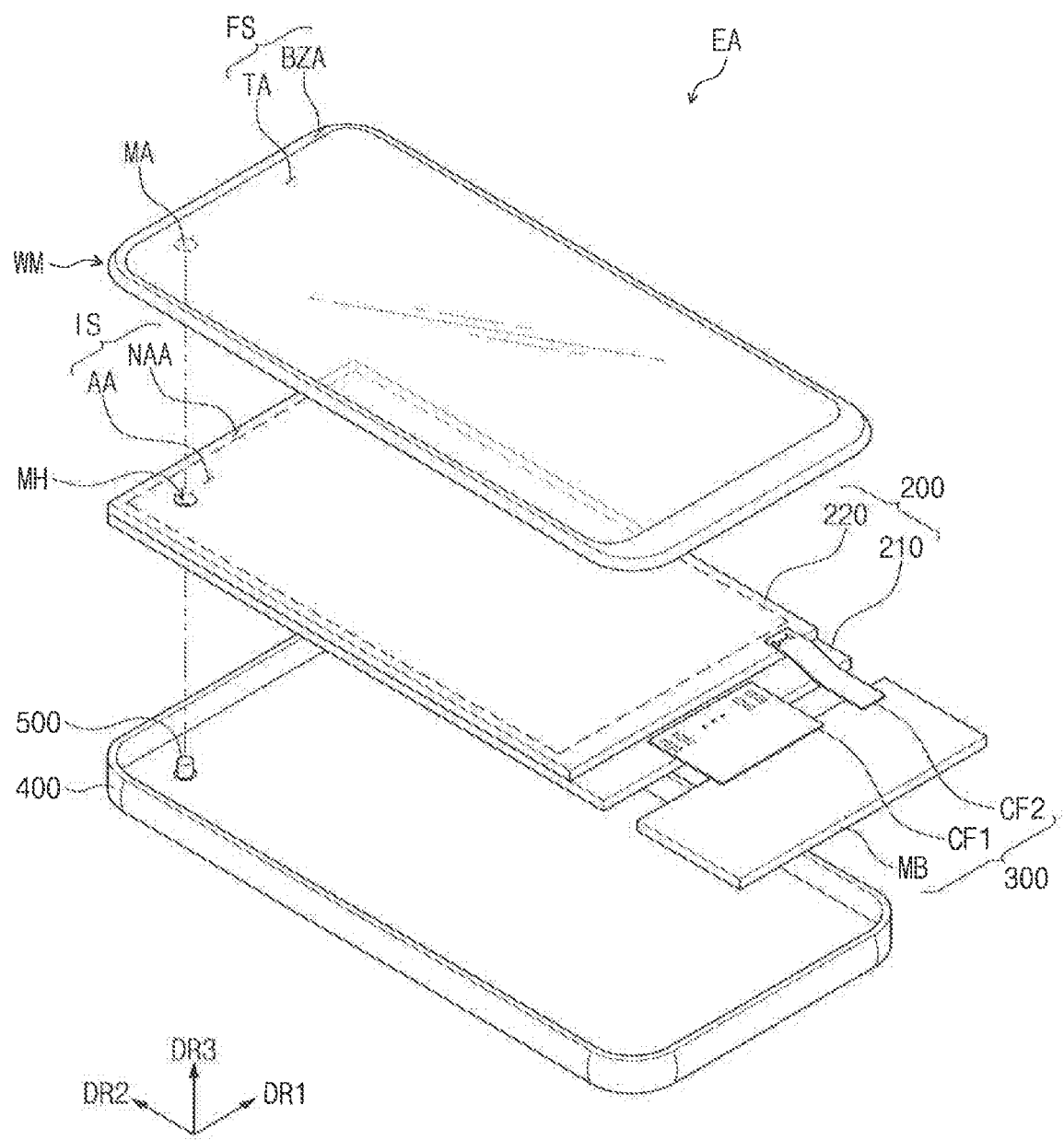
FIG. 1B is an exploded perspective view showing an electronic device according to an exemplary embodiment of the present disclosure.
Figure 2:
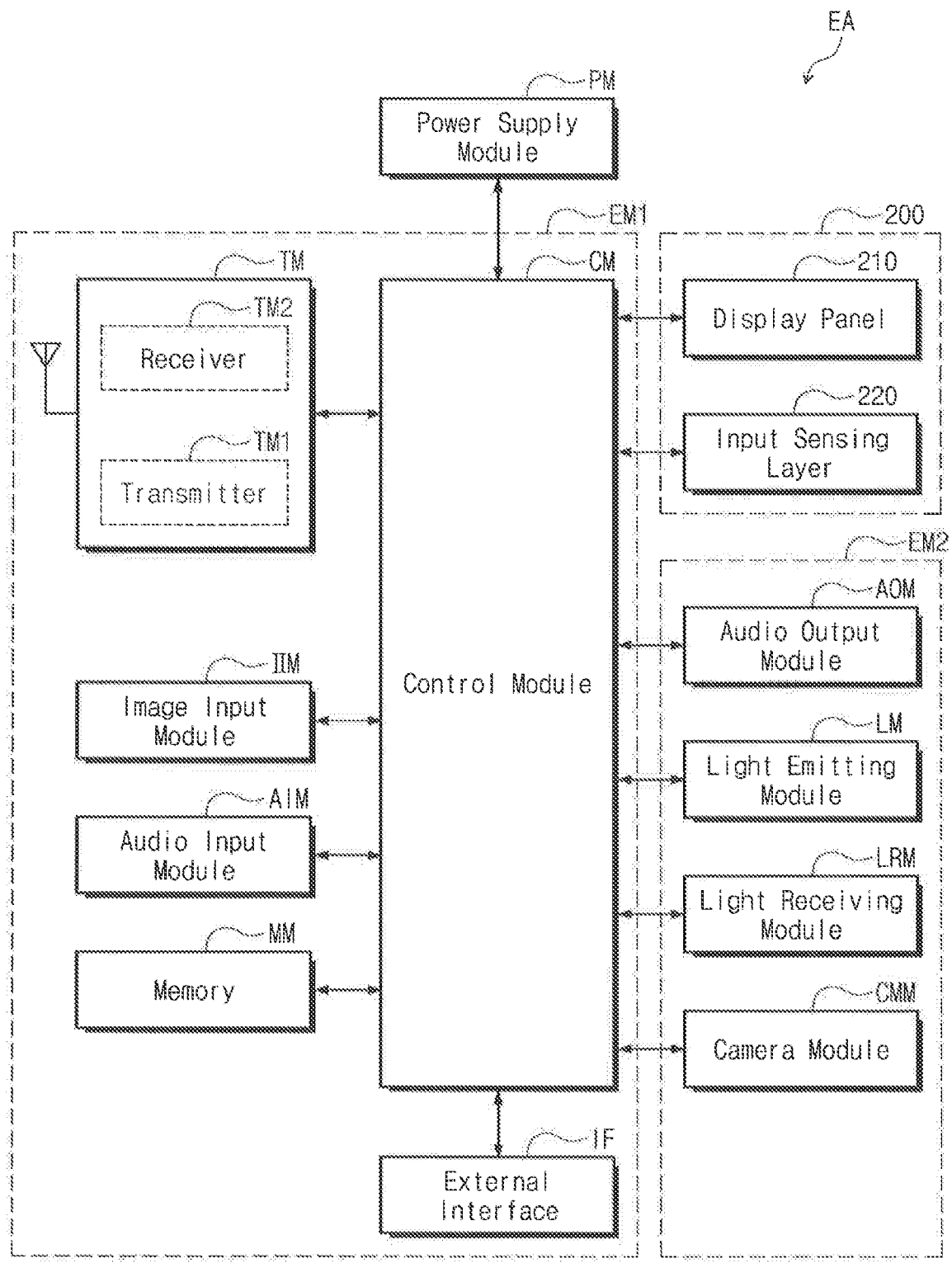
FIG. 2 is a block diagram showing an electronic device according to an exemplary embodiment of the present disclosure.

FIG. 1A is a perspective view showing an electronic device EA according to an exemplary embodiment of the present disclosure. FIG. 1B is an exploded perspective view showing the electronic device FA according to an exemplary embodiment of the present disclosure. FIG. 2 is a block diagram showing the electronic device EA according to an exemplary embodiment of the present disclosure.

Referring to FIGS. 1A, 1B, and 2, the electronic device EA may be activated in response to electrical signals to display an image. In exemplary embodiments, the electronic device EA may be a smart phone, a tablet computer, a notebook computer, a television set, etc. In the present exemplary embodiment, a smart phone will be described as a representative example of the electronic device EA.

The electronic device EA may display an image IM in a third direction DR3 toward the user through a display surface FS that is defined in the first direction DR1 and a second direction DR2. The display surface FS through which the image IM is displayed may correspond to a front surface of the electronic device EA (e.g., a top surface of the electronic device EA in the third direction DR3) and a front surface of a window WM (e.g., a top surface of the window WM in the third direction DR3). Hereinafter, the display surface FS and the front surface of the electronic device EA and the front surface of the window WM are assigned with the same reference numeral. The image IM may include one or more still images, full motion video, and combinations thereof. FIG. 1A shows a clock window and application icons as a representative example of the image IM. However, the image IM displayed by the electronic device EA is not limited to these representative examples.

In the present exemplary embodiment, front (or upper) and rear (or lower) surfaces of each member are defined with respect to a direction in which the image IM is displayed. The front and rear surfaces are opposite to each other in the third direction DR3, and a normal line direction of each of the front and rear surfaces is substantially parallel to the third direction DR3. Directions indicated by the first, second, and third directions DR1, DR2, and DR3 are relative to each other. Therefore, the directions indicated by the first, second, and third directions DR1, DR2, and DR3 may be changed to other directions than those shown in the exemplary embodiments.

As shown in FIG. 1B, the electronic device EA includes the window WM, a display module 200, a driving circuit unit 300, a housing 400, and an electronic module 500. In the present exemplary embodiment, the window WM and the housing 400 are coupled to each other to define an interior and an exterior of the electronic device EA.

The window WM includes an optically transparent insulating material. For example, in an exemplary embodiment, the window WM may include glass, plastic or combinations thereof. The window WM has a single-layer or multi-layer structure. For example, the window WM with a multi-layer structure includes a plurality of plastic films attached to each other by an adhesive or includes a glass substrate and a plastic film attached to the glass substrate by an adhesive.

The window WM may be divided into a transmission area TA and a bezel area BZA when viewed in a plan view. In the present disclosure, the expression "when viewed in a plan view" may mean a state of being viewed in the third direction DR3. In addition, the expression "thickness direction" may mean the third direction DR3.

The transmission area TA may be an optically transparent area. The bezel area BZA may be an area having a light transmittance that is relatively lower than the transmission area TA. The bezel area BZA may be disposed adjacent to the transmission area TA and may surround the transmission area TA. The bezel area BZA may define a shape of the transmission area TA.

The bezel area BZA may have a predetermined color. The bezel area BZA may cover a non-active area NAA of the display module 200 to prevent the non-active area NAA from being viewed from the outside by the user. However, in other exemplary embodiments of the present disclosure the bezel area BZA may be omitted from the window WM.

In an exemplary embodiment of the present disclosure, the window WM includes a module area MA. The module area MA may overlap (e.g., in the third direction DR3) with the electronic module 500 described later. The electronic device EA may receive external signals for input into the electronic module 500 or may send signals output from the electronic module 500 to the outside (e.g., to an external device) through the module area MA. According to an exemplary embodiment of the present disclosure, the module area MA may be disposed within the transmission area TA. Accordingly, as the module area MA moves from the bezel area BZA to the transmission area TA, the width of the bezel area BZA may decrease.

FIG. 1B shows one module area MA. However, exemplary embodiments of the present disclosure are not limited thereto. For example, the electronic device EA may include a plurality of module areas MA. Additionally, in the exemplary embodiment shown in FIG. 1B, the module area MA is positioned in a left upper end of the transmission area TA. However, exemplary embodiments of the present disclosure are not limited thereto. For example, the module area MA may be positioned in various other areas of the transmission area TA, such as a right upper end of the transmission area TA, a center of the transmission area TA, a left lower end of the transmission area TA, a right lower end of the transmission area TA, etc.

As shown in FIG. 1B, the display module 200 may be disposed under the window W M. In the present disclosure, the term "under" may mean a direction (e.g., in the third direction DR3) opposite to the direction in which the display module 200 displays the image IM. The display module 200 may display the image IM and may sense an external input TC. The display module 200 may include a front surface IS (e.g., a top surface of the display module 200 in the third direction DR3) including an active area AA and a non-active area NAA. The active area AA may be activated in response to electrical signals.

In the present disclosure, the active area AA of the display module 200 may be the area in which the image IM is displayed and the external input TC is sensed. The transmission area TA of the window WM may overlap (e.g., in the third direction DR3) with the active area AA. For example, the transmission area TA may overlap with at least a portion or the entire surface of the active area AA. Therefore, the user may view the image IM through the transmission area TA or may input the external input TC through the transmission area TA.

The bezel area BZA of the window WM may overlap (e.g., in the third direction DR3) the non-active area NAA of the display module 200. Therefore, the non-active area NAA may be covered by the bezel area BZA. The non-active area NAA may be disposed adjacent to the active area AA. For example, the non-active area NAA may be disposed on the perimeter of the active area AA. The non-active area NAA may surround the active area AA and define a shape of the active area AA. A driving circuit unit 300 or a driving line may be disposed in the non-active area NAA to drive the active area AA.

In the present exemplary embodiment, the display module 200 has a flat shape in the active area AA and the non-active area NAA. However, exemplary embodiments of the present disclosure are not limited thereto. For example, the display module 200 may be partially bent in the non-active area NAA. In this embodiment, the display module 200 may be bent toward a rear surface of the electronic device EA in the non-active area NAA. The bent portion of the display module 200 may overlap the active area AA (e.g., in the third direction DR3) and may be disposed below the active area AA. In this embodiment, the bezel area BZA of the window WM may not overlap the bent portion of the display module 200 and the area of the bezel area BZA may be reduced in the display surface FS of the electronic device EA. In another exemplary embodiment, the display module 200 may have a partially-bent shape in the active area AA. In another exemplary embodiment, the non-active area NAA may be omitted from the display module 200.

The display module 200 includes a display panel 210 and an input sensing layer 220.

The display panel 210 may be configured to substantially generate the image IM. The display panel 210 may display the generated image IM through the front surface IS. The user may view the image IM from the outside through the transmission area TA of the window WM.

The input sensing layer 220 senses the external input TC provided from the outside. For example, the input sensing layer 220 may sense the external input TC provided through the window WM. The external input TC may be a user input. The user input may include various forms of external inputs, such as a portion of the user's body, light, heat, pen, pressure, etc. In the exemplary embodiment shown in FIG. 1A, the external input TC is shown as a touch operation using the user's hand applied via the display surface FS of the electronic device EA. However, exemplary embodiments of the present disclosure are not limited thereto. As described above, the external input TC may be provided in various forms, and the electronic device EA may sense the external input TC applied to the electronic device EA depending on a structure of the electronic device EA.

The driving circuit unit 300 may be electrically connected to the display panel 210 and the input sensing layer 220. The driving circuit unit 300 may include a main circuit board MB, a first flexible film CF1, and a second flexible film CF2.

The first flexible film CF1 is electrically connected to the display panel 210. The first flexible film CF1 connects the display panel 210 and the main circuit board MB. The first flexible film CF1 is connected to pads (e.g., display pads) of the display panel 210, which are arranged in the non-active area NAA. The first flexible film CF1 provides the display panel 210 with electrical signals to drive the display panel 210. The electrical signals are generated by the first flexible film CF1 or the main circuit board MB.

The second flexible film CF2 is electrically connected to the input sensing layer 220. The second flexible film CF2 connects the input sensing layer 220 and the main circuit board MB. The second flexible film CF2 is connected to pads (e.g., sensing pads) of the input sensing layer 220, which are arranged in the non-active area NAA. The second flexible film CF2 provides the input sensing layer 220 with electrical signals to drive the input sensing layer 220. The electrical signals are generated by the second flexible film CF2 or the main circuit board MB.

The main circuit board MB may include various driving circuits that drive the display module 200. The main circuit board MB may also include a connector used to supply a power. The first flexible film CF1 and the second flexible film CF2 may be connected to the main circuit board MB. According to an exemplary embodiment of the present disclosure, the display module 200 may be controlled by using one main circuit board MB. However, in other exemplary embodiments, the main circuit board MB may include a plurality of circuit boards. For example, the display panel 210 and the input sensing layer 220 may be connected to different main circuit boards from each other and one of the first flexible film CF1 and the second flexible film CF2 may not be connected to the main circuit board MB.

In the exemplary embodiment of the present disclosure, an area of the display module 200 overlapping (e.g., in the third direction DR3) the module area MA of the window WM may have a relatively higher transmittance than the active area AA that does not overlap with the module area MA. For example, at least some of components of the display panel 210 and components of the input sensing layer 220 may be omitted in this area. Accordingly, the electronic module 500 disposed to overlap with the module area MA may easily transmit and/or receive signals through the module area MA.

FIG. 1B shows a structure in which a predetermined hole MH (hereinafter, referred to as "module hole") is defined in an area of the display module 200 overlapping (e.g., in the third direction DR3) the module area MA. The module hole MH is defined in the active area AA to penetrate through the display module 200. The module hole MH penetrates through the display panel 210 and the input sensing layer 220. The module hole MH may be defined by the absence of components of the display panel 210 and the components of the input sensing layer 220 in the regions overlapping (e.g., in the third direction DR3) with the module area MA. Since the module hole MH is defined in the active area AA of the display module 200, the module area MA of the window WM may be provided in the transmission area TA.

When viewed in a plan view, the electronic module 500 may overlap with the module hole MH and the module area MA. The electronic module 500 may be disposed under the display module 200, and at least a portion of the electronic module 500 may be received in the module hole MH. The electronic module 500 may receive the external input TC provided through the module area MA or may provide an output through the module area MA.

The housing 400 is coupled to the window WM. The housing 400 is coupled to the window WM to form an exterior surface for the electronic device EA which defines an inner space. The display module 200 and the electronic module 500 may be positioned within the inner space.

The housing 400 may include a material with a relatively high rigidity. For example, in an exemplary embodiment, the housing 400 may include a plurality of frames and/or plates containing glass, plastic, metal, or combinations thereof. The housing 400 may stably protect the components of the electronic device EA that are positioned within the inner space from external impacts.

Referring to FIG. 2, the electronic device EA includes the display module 200, a power supply module PM, a first electronic module EM1, and a second electronic module EM2. The display module 200, the power supply module PM, the first electronic module EM1, and the second electronic module EM2 are electrically connected to each other.

The power supply module PM supplies a power sufficient for the overall operation of the electronic device EA. The power supply module PM includes a conventional battery module.

The first electronic module EM1 and the second electronic module EM2 include various functional modules to operate the electronic device EA.

The first electronic module EM1 is directly mounted on a mother board electrically connected to the display module 200 or is electrically connected to the mother board through a connector (not shown) after being mounted on a separate board.

The first electronic module EM1 includes a control module CM, a wireless communication module TM, an image input module IIM, an audio input module AIM, a memory MM, and an external interface IF. Some of the modules are electrically connected to the mother board through a flexible printed circuit board without being mounted on the mother board.

The control module CM controls the overall operation of the electronic device EA. In an exemplary embodiment, the control module CM may be a microprocessor. However, exemplary embodiments are not limited thereto. For example, the control module CM activates or deactivates the display module 200. The control module CM controls other modules, such as the image input module IIM or the audio input module AIM, based on a touch signal provided from the display module 200.

The wireless communication module TM may transmit/receive a wireless signal to/from another terminal by using a Bluetooth or Wi-Fi line. The wireless communication module TM may transmit/receive a voice signal by using a conventional communication line. The wireless communication module TM may include a transmitter TM1 that modulates a signal to be transmitted and transmits the modulated signal and a receiver TM2 that demodulates the signal applied thereto.

The image input module IIM processes an image signal and converts the image signal into image data that may be displayed through the display module 200. The audio input module AIM receives an external audio signal through a microphone in a recording mode and a voice recognition mode and converts the audio signal into electrical voice data.

The external interface IF serves as an interface between the control module CM and external devices, such as an external charger, a wired/wireless data port, and a card socket (e.g., a memory card and a SIM/UIM card).

The second electronic module EM2 includes an audio output module AOM, a light emitting module LM, a light receiving module LRM, and a camera module CMM. The components of the second electronic module EM2 are directly mounted on the mother board, electrically connected to the display module 200 through a connector after being mounted on a separate substrate, or electrically connected to the first electronic module EM1.

The audio output module AOM converts and outputs the audio data provided from the wireless communication module TM or the audio data stored in the memory MM to a speaker or an external device.

The light emitting module LM may generate and emit a light. For example, in an exemplary embodiment, the light emitting module LM may emit an infrared light. The light emitting module LM may include a light emitting diode (LED) device. The light receiving module LRM may sense the infrared light. The light receiving module LRM may be activated when sensing the infrared light equal to or greater than a predetermined level. The light receiving module LRM may include a complementary metal oxide semiconductor (CMOS) sensor. The infrared light generated by the light emitting module LM may be incident into the light receiving module LRM after being output from the light emitting module LM and being reflected by an external object, such as a user's finger or face. The camera module CMM may photograph an external image.

In an exemplary embodiment, the electronic module 500 may include at least one of the components of the first electronic module EM1 and the second electronic module EM2. For example, the electronic module 500 may include at least one of the audio output module AOM, the light emitting module LM, the light receiving module LRM, the camera module CMM, and a heat sensing module. The electronic module 500 may sense an external subject provided through the module area MA or may provide a sound signal such as a voice or a light such as an infrared light to the outside. In addition, the electronic module 500 may include a plurality of modules, however, it should not be limited to a particular embodiment.

Figure 3:
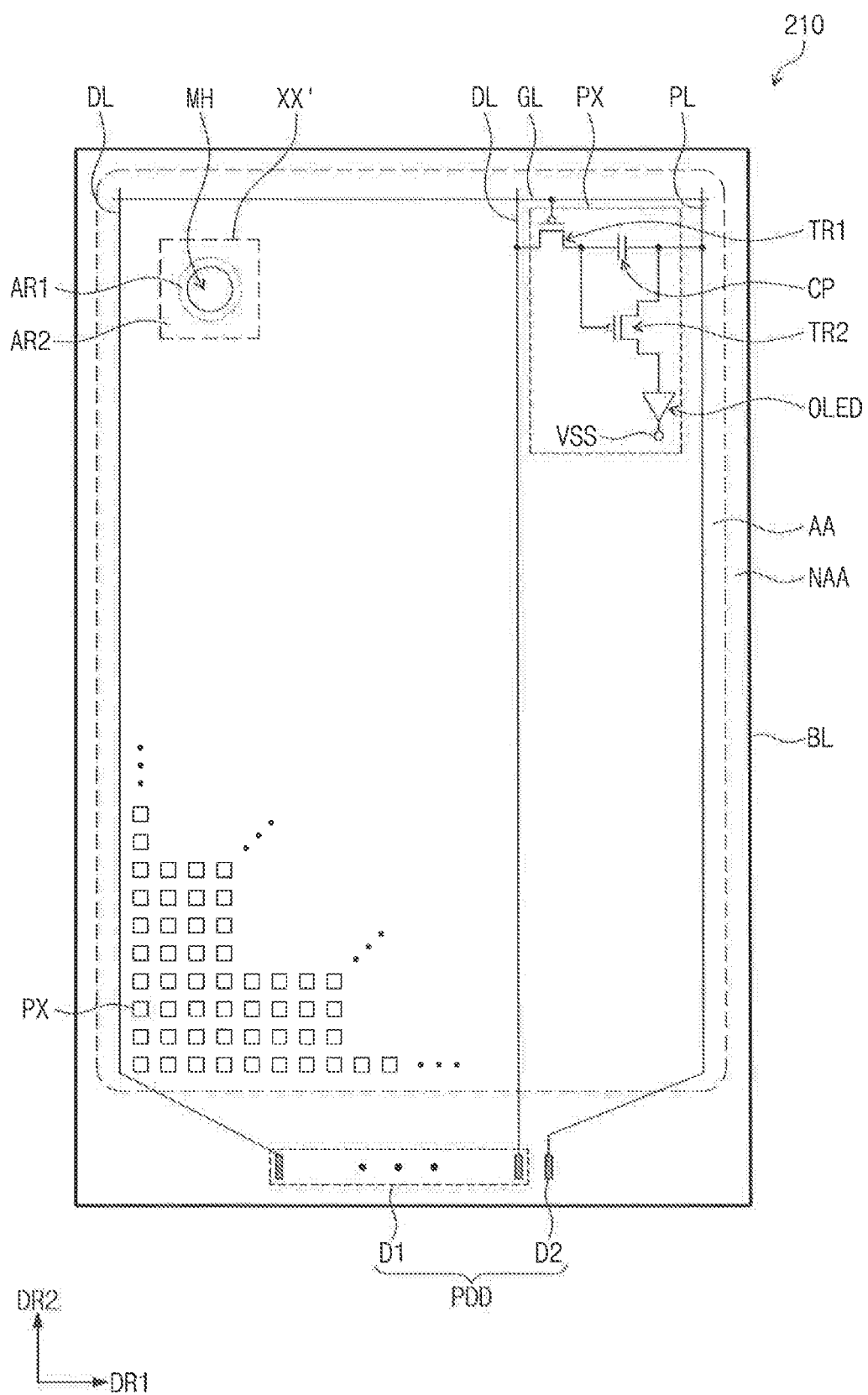
FIG. 3 is a plan view showing a display panel according to an exemplary embodiment of the present disclosure.
Figure 4:
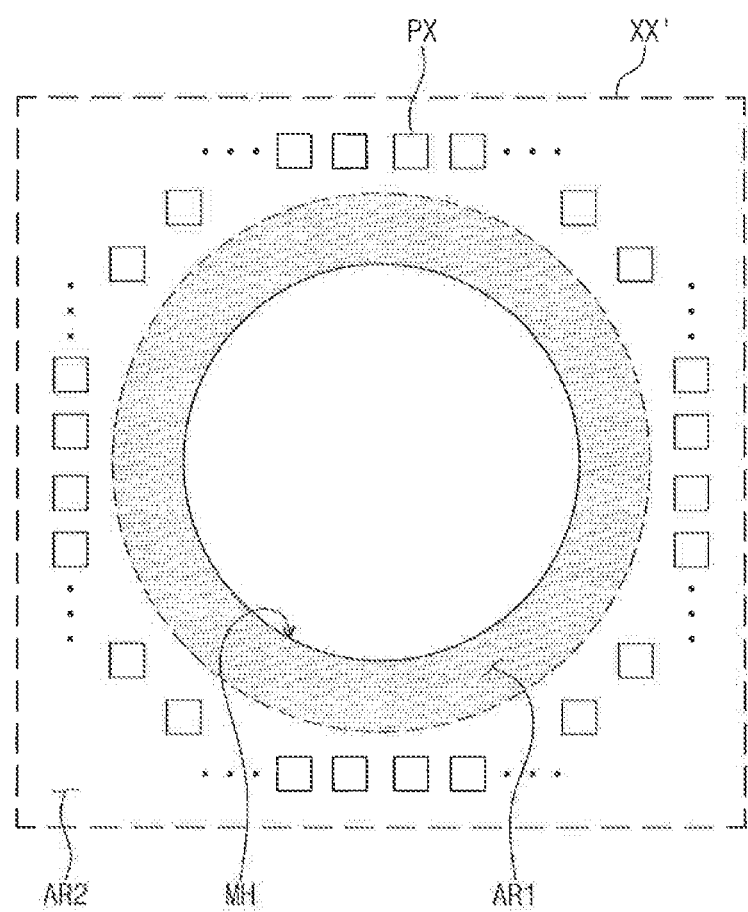
FIG. 4 is an enlarged plan view showing area XX' of FIG. 3.

FIG. 3 is a plan view showing the display panel 210 according to an exemplary embodiment of the present disclosure, and FIG. 4 is an enlarged plan view showing an area XX shown in FIG. 3.

Referring to FIGS. 3 and 4, the display panel 210 includes a base layer BL, a plurality of pixels PX, a plurality of signal lines GL, DL, and PL, and a plurality of display pads PDD.

The active area AA of the display panel 210 is an area in which the image IM is displayed, and the non-active area NAA is an area in which the driving circuit unit 300 or the driving line is disposed. FIG. 3 shows the active area AA and the non-active area NAA of the display panel 210. The pixels PX are disposed in the active area AA.

The base layer BL may be a stack structure. For example, the base layer BL may include a silicon substrate, a plastic substrate, a glass substrate, an insulating film, or a plurality of insulating layers.

The active area AA may include a first area AR1 and a second area AR2. When viewed in a plan view, the second area AR2 may surround the first area AR1. The second area AR2 may be the display area in which the image IM is displayed and may be surrounded by the non-active area NAA. The pixels PX may be disposed on the base layer BL to correspond to the second area AR2.

At least a portion of the first area AR1 may overlap with the module area MA of the window WM when viewed in a plan view. The module hole MH may be defined within the first area AR1. For example, the module hole MH may be defined by partially or entirely removing the components of the display panel 210 and may be disposed to overlap with the module area MA of the window WM. The first area AR1 may also include the portion of the active area AA immediately surrounding the module hole MH when viewed in a plan view.

The pixels PX that provide the image may not be disposed on the first area AR1 of the base layer BL. Accordingly, the first area AR1 may be defined as a non-display area within the active area AA. The pixels PX may be disposed on the second area AR2 of the base layer BL. Therefore, the second area AR2 may be defined as a display area in the active area AA.

According to the present disclosure, the non-display area AR1 may be disposed to be surrounded by the display area AR2 when viewed in a plan view. As shown in FIG. 1B, the non-display area AR1 may overlap with the module area MA of the window WM. Therefore, the first area AR1 may obviate the need for a separate area outside the active area AA to provide module areas. Accordingly, areas outside the active area AA for modules may be omitted in the electronic device EA and the sizes of the non-active area NAA and the bezel area BZA may be reduced.

Various signal lines are connected to the pixels PX to apply electrical signals to the pixels PX. For example, in the exemplary embodiment shown in FIG. 3, the signal lines included in the display panel 210 are a scan line GL, a data line DL, and a power line PL. However, exemplary embodiments of the present disclosure are not limited thereto. In other exemplary embodiments, the signal lines may further include at least one of an initialization voltage line, a light emitting control line, etc. The signal lines GL, DL, and PL may be disposed on the second area AR2 of the base layer BL.

In the exemplary embodiment shown in FIG. 3, an equivalent circuit diagram of one pixel PX among the pixels PX is enlarged and shown as a representative example. The pixel PX may include a first transistor TR1, a capacitor CP, a second transistor TR2, and a light emitting device OLED. The first transistor TR1 may be a switching device that controls an ON/OFF of the pixel PX. The first transistor TR1 may transmit or block a data signal applied thereto through the data line DL in response to a scan signal applied thereto through the scan line GL.

The capacitor CP is connected to the first transistor TR1 and the power line PL. The capacitor CP is charged with electric charges corresponding to an electric potential difference between the data signal provided from the first transistor TR1 and a power signal (hereinafter, referred to as the "first power signal") applied to the power line PL.

The second transistor TR2 is connected to the first transistor TR1, the capacitor CP, and the light emitting device OLED. The second transistor TR2 controls a driving current flowing through the light emitting device OLED in response to an amount of the electric charges charged in the capacitor CP. A turn-on time of the second transistor TR2 is determined by the amount of the electric charges charged in the capacitor CP. The second transistor TR2 applies the first power signal provided through the power line PL to the light emitting device OLED during its turn-on time.

The light emitting device OLED may generate light or may control an amount of the light that is generated in response to the electrical signals. In an exemplary embodiment, the light emitting device OLED may include an organic light emitting device or a quantum dot light emitting device.

The light emitting device OLED is connected to a power terminal VSS to receive a power signal (hereinafter, referred to as "second power signal") different from the first power signal provided through the power line PL. The driving current corresponding to a difference between the electrical signals provided from the second transistor TR2 and the second power signal flows through the light emitting device OLED. The light emitting device OLED generates the light corresponding to the driving current. However, the light emitting device OLED described above is merely exemplary. The pixel PX may include electronic devices having various different configurations and arrangements as compared to the described exemplary embodiment and should not be particularly limited.

The display pads PDD may include a first pad D1 and a second pad D2. The first pad D1 may include a plurality of first pads and the first pads D1 may be connected to the data lines DL. The second pad D2 may be electrically connected to the power line PL. The display panel 210 may apply the electrical signals provided thereto from the outside through the display pads PDD to the pixels PX. The display pads PDD may further include additional pads to receive other electrical signals aside from the first pad D1 and the second pad D2 and the display pads PDD should not be limited to the exemplary embodiment shown in FIG. 3.

Figure 5:
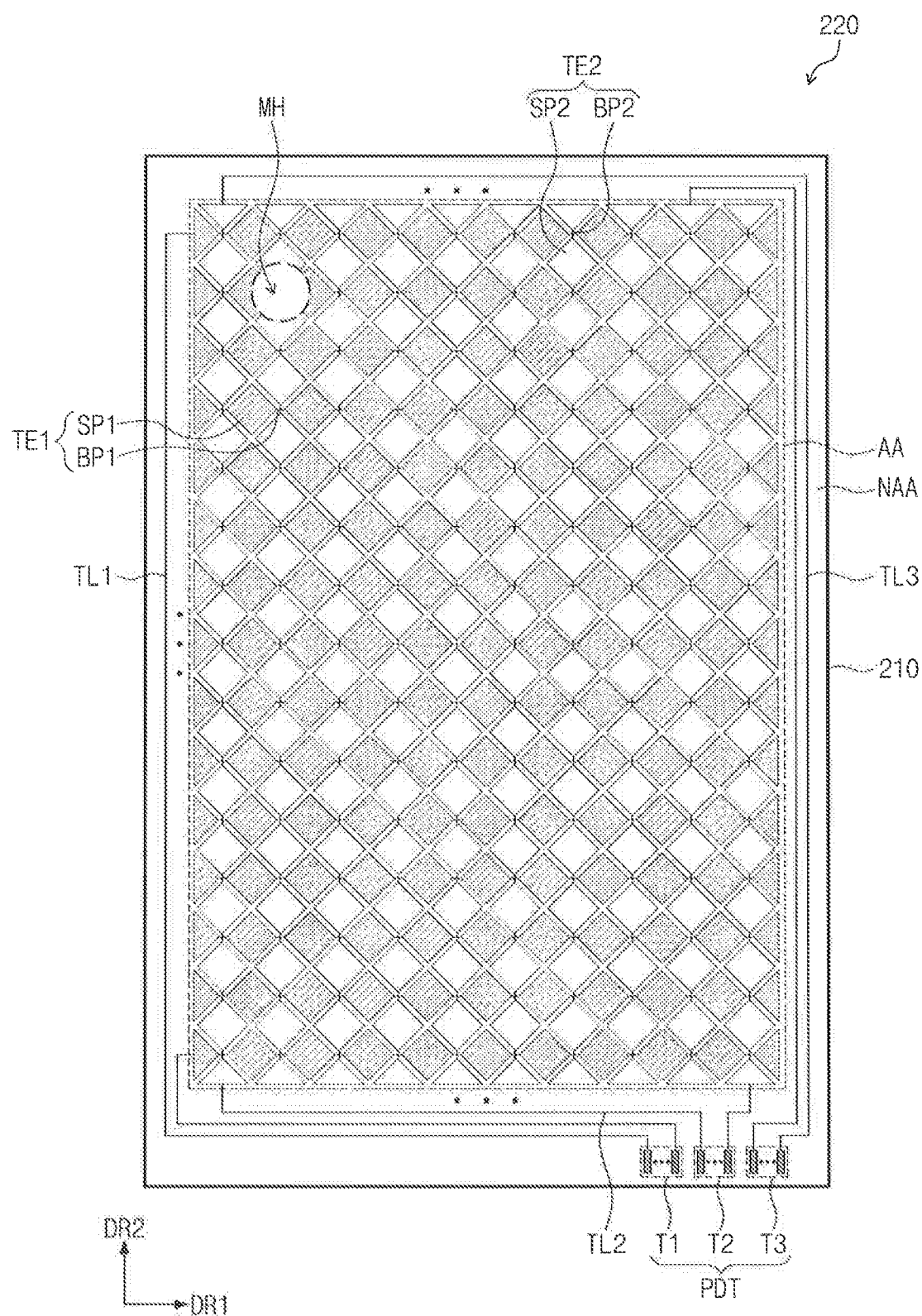
FIG. 5 is a plan view showing an input sensing layer according to an exemplary embodiment of the present disclosure.

FIG. 5 is a plan view showing the input sensing layer 220 according to an exemplary embodiment of the present disclosure.

Referring to FIG. 5, the input sensing layer 220 may be disposed on the display panel 210. For example, in an exemplary embodiment, the input sensing layer 220 may be directly disposed on the display panel 210 or may be coupled to the display panel 210 by an adhesive member. The input sensing layer 220 may be formed on the display panel 210 through successive processes after the display panel 210 is formed.

In an exemplary embodiment, the input sensing layer 220 may include a first sensing electrode TE1, a second sensing electrode TE2, a plurality of sensing lines TL1, TL2, and TL3, and a plurality of sensing pads PDT. However, other exemplary embodiments may have different numbers and arrangements of sensing electrodes TE1 and TE2, sensing lines TL and TL2 and sensing pads PDT. Accordingly, exemplary embodiments of the present disclosure are not limited thereto.

The first sensing electrode TE1 and the second sensing electrode TE2 are disposed in the active area AA. For example, as shown in the exemplary embodiment of FIG. 5, the first sensing electrode TE1 and second sensing electrode TE2 are arranged in an array of rows and columns with the first sensing electrode TE1 and second sensing electrode TE2 alternating in adjacent columns. The input sensing layer 220 may obtain information on the external input TC (refer to FIG. 1A) based on a variation in capacitance between the first sensing electrode TE1 and the second sensing electrode TE2.

The first sensing electrode TE1 includes first sensing patterns SP1 and first connection patterns BP1. At least one first connection pattern BP1 is connected to two first sensing patterns SP1 that are positioned adjacent to each other. The second sensing electrode TE2 includes second sensing patterns SP2 and second connection patterns BP2. At least one second connection pattern BP2 is connected to two second sensing patterns SP2 that are adjacent to each other.

The sensing lines are mainly disposed in the non-active area NAA. In the exemplary embodiment shown in FIG. 5, the sensing lines include a first sensing line TL1, a second sensing line TL2, and a third sensing line TL3.

The first sensing line TL1 is connected to the first sensing electrode TEL. The second sensing line TL2 is connected to a first end of the second sensing electrode TE2. The third sensing line TL3 is connected to a second end of the second sensing electrode TE2. The first end of the second sensing electrode TE2 is opposite to the second end of the second sensing electrode TE2. For example, the first end of the second sensing electrode TE2 may be spaced apart from the second end of the second sensing electrode TE2 in the second direction DR2.

According to the present disclosure, the second sensing electrode TE2 is connected to the second sensing line TL2 and the third sensing line TL3. Accordingly, a sensitivity with respect to an area of the second sensing electrode TE2, which has a longer length than the first sensing electrode TE1, may be uniformly maintained. However, exemplary embodiments of the present inventive concepts are not limited to this particular configuration. For example, in other exemplary embodiments, the third sensing line TL3 may be omitted.

The sensing pads PDT are disposed in the non-active area NAA. In the exemplary embodiment shown in FIG. 5, the sensing pads PDT include a first sensing pad T1, a second sensing pad T2, and a third sensing pad T3. However, exemplary embodiments of the present disclosure are not limited thereto. The first sensing pad T1 is connected to the first sensing line TL1 and electrically connected to the first sensing electrode TE1. The second sensing pad T2 is connected to the second sensing line TL2, and the third sensing pad T3 is connected to the third sensing line TL3. Therefore, the second sensing pad T2 and the third sensing pad T3 are electrically connected to the second sensing electrode TE2.

Some of the components of the input sensing layer 220 may be removed from an area overlapping (e.g., in the third direction DR3) the module area MA of the window WM. For example, a portion of the first sensing electrode TE1 and a portion of the second sensing electrode TE2 may not be disposed in the area overlapping the module area MA. In the present exemplary embodiment, the first sensing electrode TE1 may have the portion of the first sensing pattern SP1 that overlaps with the module area MA removed and the second sensing electrode TE2 may have the portion of the second sensing pattern SP2 that overlaps with the module area MA removed.

According to the present disclosure, since the sensing electrodes TE1 and TE2 are removed in the area overlapping with the module area MA, the electronic module 500 (refer to FIG. 1B) may be prevented from being covered by the first sensing electrode TE1 or the second sensing electrode TE2. Therefore, the sensing sensitivity of the electronic module 500 may be improved.

Figure 6:
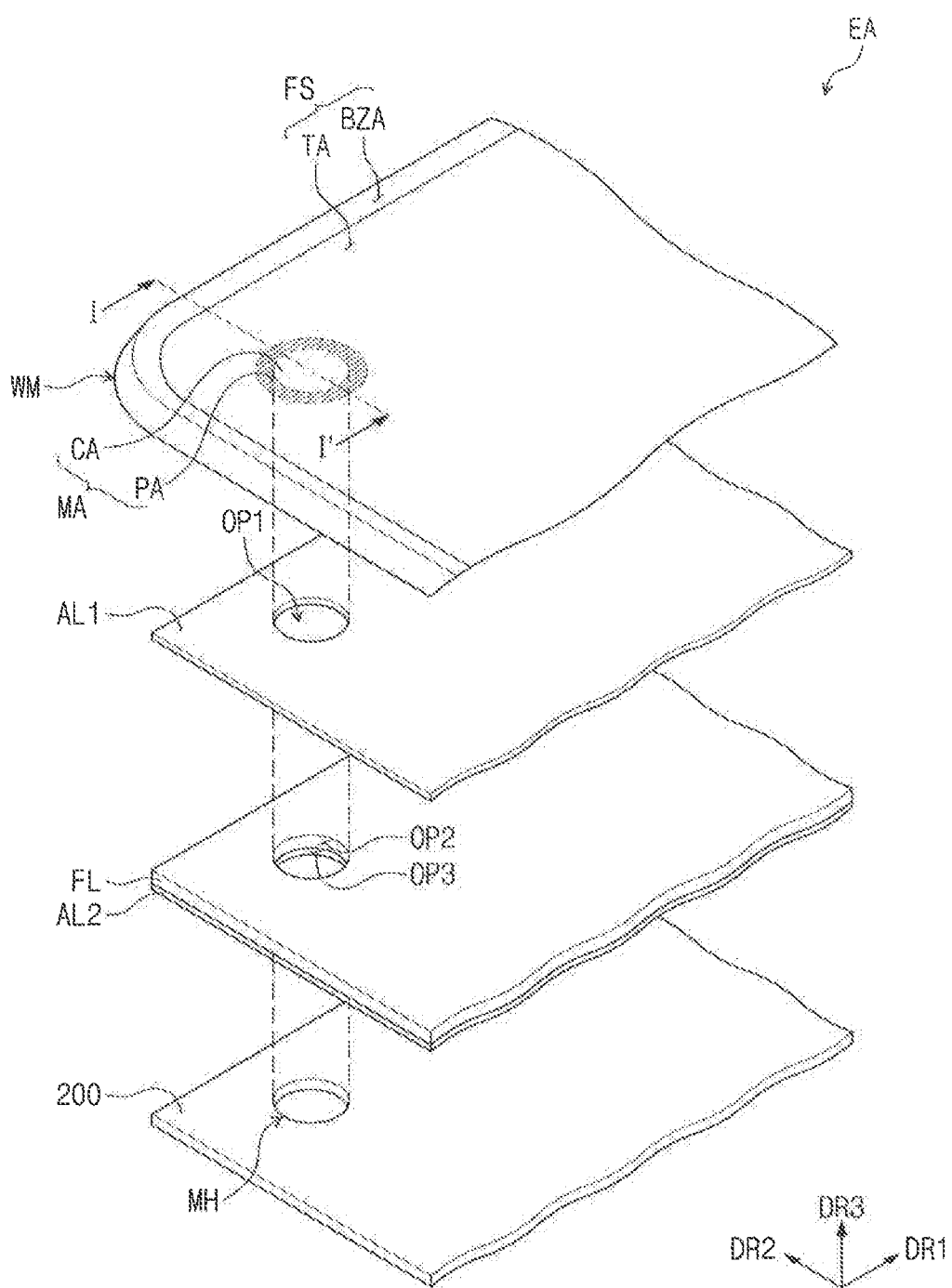
FIG. 6 is an exploded perspective view showing a module area and a module hole of an electronic device according to an exemplary embodiment of the present disclosure.
Figure 7:
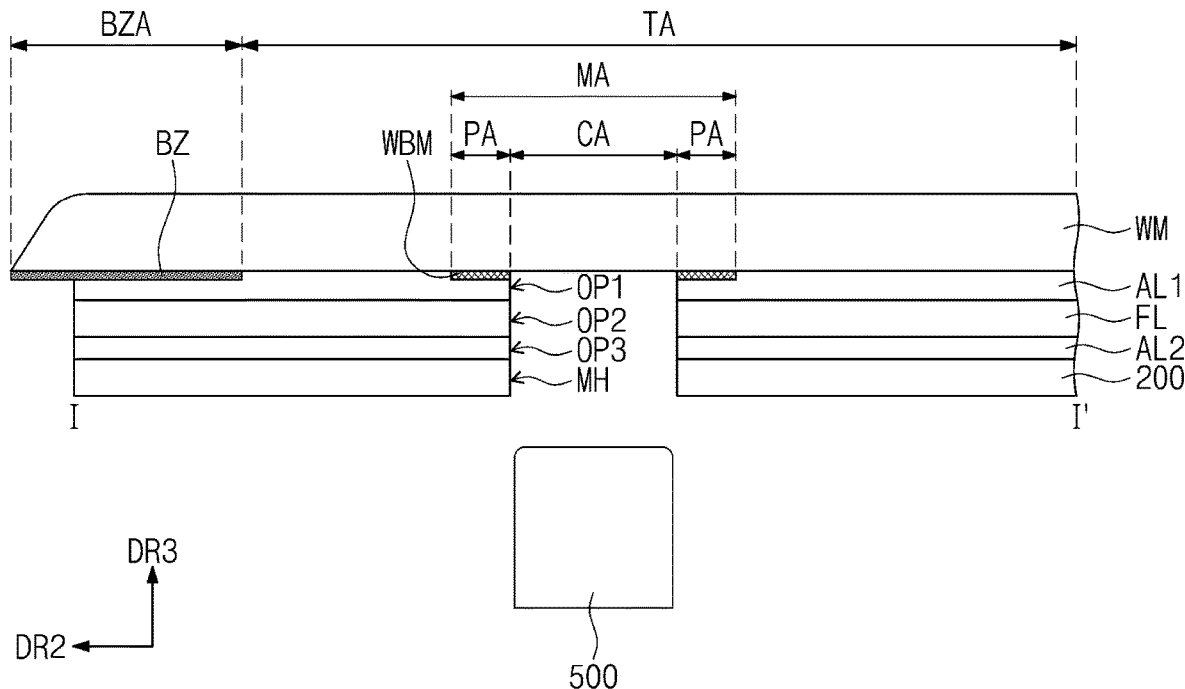
FIG. 7 is a cross-sectional view taken along a line I-I' of FIG. 6.

FIG. 6 is an exploded perspective view showing a module area and module hole of an electronic device according to an exemplary embodiment of the present disclosure, and FIG. 7 is a cross-sectional view taken along a line I-I' shown in FIG. 6.

Referring to FIGS. 6 and 7, the window WM provides the front surface of the electronic device EA (e.g., a top surface of the electronic device EA in the third direction DR3). The window WM is disposed on the entire surface of the display module 200 (e.g., in a plane defined by the first direction DR1 and second direction DR2) to protect the display module 200. In an exemplary embodiment, the window WM may include a glass substrate, a sapphire substrate, a plastic film, etc.

The window WM may include a transparent material and provides the transmission area TA and the bezel area BZA of the electronic device EA. According to the present exemplary embodiment, the transmission area TA of the window WM may be an area overlapping the active area AA of the display panel 210. For example, the transmission area TA may overlap partially or with the entire portion of the active area AA. The image IM displayed through the active area AA of the display panel 210 may be viewed by the user from the outside through the transmission area TA.

The window WM may further include a bezel layer BZ. The bezel layer BZ may define the bezel area BZA. For example, in the present exemplary embodiment, an area in which the bezel layer BZ is disposed on the window WM may be defined as the bezel area BZA, and an area that is exposed and is not covered by the bezel layer BZ may be the transmission area TA. The bezel layer BZ may include a pattern layer that provides a predetermined pattern and an achromatic layer. The pattern layer may provide a pattern called a hair line. The achromatic layer may include an organic mixture containing a black pigment or dye. In an exemplary embodiment, the bezel layer BZ may be formed by a depositing, printing, or coating method.

The window WM may further include a window black matrix WBM. In an exemplary embodiment, the window black matrix WBM may be printed on a rear surface of the window WM (e.g., the bottom surface of the window WM in the third direction DR3). The window black matrix WBM may be printed to have a color with a high light shielding property. In an exemplary embodiment, the window black matrix WBM may include an organic mixture containing a black pigment or dye. However, the window black matrix WBM may be any material having a high light shielding property.

The window black matrix WBM may be positioned within the module area MA of the window WM and may not overlap (e.g., in the third direction DR3) with the module hole MH. For example, the window black matrix WBM may be positioned within a peripheral area PA of the module area MA which overlaps a portion of the display module 200 that surrounds the module hole MH. The window black matrix WBM prevents a light passing through the module hole MH from leaking in a peripheral area of the module hole MH and from passing through the transmission area TA of the window WM for viewing by the user.

According to an exemplary embodiment of the present disclosure, the module area MA of the window WM may include a center area CA which overlaps (e.g., in the third direction DR3) the module hole MH and the peripheral area PA. The window black matrix WBM is disposed in the peripheral area PA. The window black matrix WBM may be disposed in the peripheral area PA to prevent a light leakage phenomenon in which the light leaks from the peripheral area PA.

An anti-glare layer may be further disposed between the window black matrix WBM and the window WM or between the window black matrix WBM and the display module 200. The anti-glare layer may be disposed in the peripheral area PA of the module area MA or areas overlapping therewith to prevent a glare phenomenon due to the light leaking from the peripheral area PA.

The electronic device EA may include one or more functional layers FL disposed between the window WM and the display module 200. For example, in the exemplary embodiment of FIG. 7, the functional layer FL may be an anti-reflection layer that shields external light reflection. The anti-reflection layer may prevent the external light incident through the display surface FS of the electronic device EA from being viewed from the outside by the user after being reflected by elements of the display module 200. The anti-reflection layer may include a polarization film and/or a retardation film. The number of the retardation films and a phase retardation length (e.g., $\lambda/4$ or $\lambda/2$) of the retardation film may vary. For example, the number of the retardation films and a phase retardation length may be determined according to an operation principle of the anti-reflection layer.

The window WM and the functional layer FL may be attached to each other by a first adhesive layer AL1. The first adhesive layer AL1 may be optically clear. The first adhesive layer AL1 may be an adhesive layer manufactured by coating a liquid adhesive material and curing the liquid adhesive material or an adhesive sheet separately manufactured. For example, the first adhesive layer AL1 may be a pressure sensitive adhesive (PSA), an optical clear adhesive (OCA), or an optical clear resin (OCR).

A first opening OP1 may be defined through the first adhesive layer AL1 to overlap the module hole MH (e.g., in the third direction DR3). For example, the first opening OP1 may be formed through the first adhesive layer AL1 and may overlap the center area CA of the module area MA. The first opening OP1 may have a size that is substantially the same size as the module hole MH of the display module 200. As an example, a diameter of the first opening OP1 may be substantially the same as a diameter of the module hole MH. The electronic module 500 may be disposed within the space provided by the first opening OP1 along with the space provided by the module hole MH of the display module 200.

The functional layer FL may be fixed to the rear surface of the window WM by the first adhesive layer AL1. A second opening OP2 may be defined through the functional layer FL to overlap the module hole MH (e.g., in the third direction DR3). The second opening OP2 may be formed through the functional layer FL and may overlap the center area CA of the module area MA. The second opening OP2 may have a size that is substantially the same as the module hole MH. As an example, a diameter of the second opening OP2 may be substantially the same as the diameter of the module hole MH. The electronic module 500 may be disposed within the space provided by the second opening OP2 along with the spaces provided by the first opening OP1 and the module hole MH of the display module 200.

The functional layer FL may be attached to the upper surface (e.g., in the third direction DR3) of the display module 200 by a second adhesive layer AL2 disposed on the upper surface of the display module 200. The second adhesive layer AL2 may be optically clear. The second adhesive layer AL2 may be an adhesive layer manufactured by coating a liquid adhesive material and curing the liquid adhesive material or an adhesive sheet separately manufactured. For example, in an exemplary embodiment, the second adhesive layer AL2 may be a pressure sensitive adhesive (PSA), an optical clear adhesive (OCA), or an optical clear resin (OCR).

A third opening OP3 may be defined through the second adhesive layer AL2 to overlap the module hole MH (e.g., in the third direction DR3). The third opening OP3 may be formed through the second adhesive layer AL2 and may overlap the center area CA of the module area MA. The third opening OP3 may have a size that is substantially the same size as the module hole MH of the display module 200. As an example, a diameter of the third opening OP3 may be substantially the same as the diameter of the module hole MH. The electronic module 500 may be disposed within the space provided by the third opening OP3 along with the spaces provided by the first and second openings OP1, OP2 and the module hole MH of the display module 200.

The module hole MH may be formed through the display module 200. The module hole MH may overlap (e.g., in the third direction DR3) with the first to third openings OP1 to OP3 and with the center area CA of the module area MA. The module hole MH may provide the space in which the electronic module 500 is disposed together with the first to third openings OP1 to OP3. Accordingly, the electronic module 500 may be inserted into the space and may be stably fixed therein.

In FIG. 7, the first to third openings OP1 to OP3 and the module hole MH have substantially the same size as each other. However, exemplary embodiments of the present disclosure are not limited thereto. For example, the first to third openings OP1 to OP3 may have a size, such as a diameter defined in the first direction DR1 and/or second direction DR2), that is greater than that of the module hole MH. In an exemplary embodiment, the diameter of the first to third openings OP1 to OP13 may be designed to increase as a distance of the respective opening to the module hole MH increases in the third direction DR3. However, in another exemplary embodiment, the diameter of the first to third openings OP1 to OP3 may decrease as a distance of the respective opening to the module hole MH increases in the third direction DR3.

Figure 8:
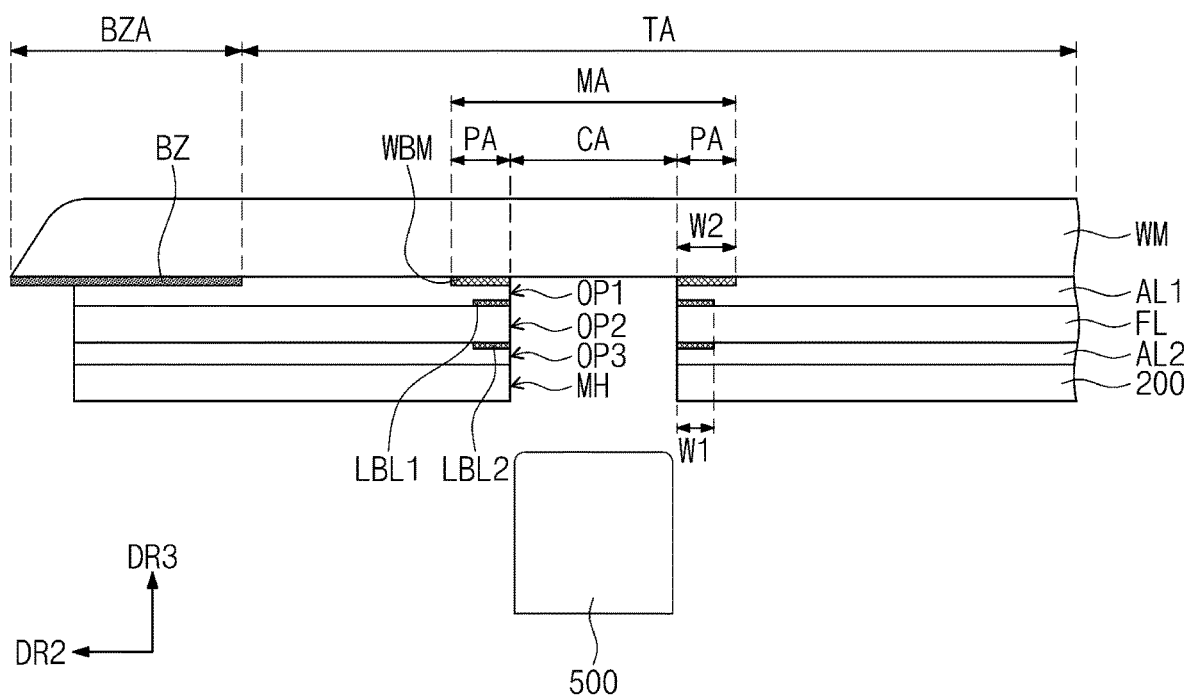
FIG. 8 is a cross-sectional view showing a module area and a module hole of an electronic device according to another exemplary embodiment of the present disclosure.

FIG. 8 is a cross-sectional view showing a module area of an electronic device according to another exemplary embodiment of the present disclosure.

Referring to FIG. 8, a second opening OP2 may be defined through the functional layer FL to overlap the module hole MH (e.g., in the third direction DR3). First and second light blocking layers LBL1 and LBL2 may be disposed in the peripheral area adjacent the second opening OP2. The first light blocking layer LBL1 may be disposed on an upper surface (e.g., in the third direction DR3) of the functional layer FL and may overlap with the peripheral area PA of the module area MA, such as in the third direction DR3. The second light blocking layer LBL2 may be disposed on a lower surface (e.g., in the third direction DR3) of the functional layer FL and may overlap with the peripheral area PA of the module area MA, such as in the third direction DR3.

As an example, the first and second light blocking layers LBL1 and LBL2 may be black matrix layers respectively formed on the upper and lower surfaces of the functional layer FL. In an exemplary embodiment, the first and second light blocking layers LBL1 and LBL2 may be respectively formed on the upper and lower surfaces of the functional layer FL by a printing, depositing, or coating method. The first and second light blocking layers LBL1 and LBL2 may include the organic material or the metal material having the light blocking property. The first and second light blocking layers LBL1 and LBL2 may have a circular ring shape and may have a size (e.g., a diameter in the first direction DR1 and/or second direction DR2) that is smaller than that of the window black matrix WBM. For example, as shown in FIG. 8, the first and second light blocking layers LBL1 and LBL2 have a width W1 (e.g., a length in the second direction DR2) that is smaller than the width W2 (e.g., a length in the second direction DR2) of the window black matrix WBM.

In the present exemplary embodiment, the first and second light blocking layers LBL1 and LBL2 have a smaller size than that of the window black matrix WBM, however, they should not be limited thereto or thereby. For example, the first and second light blocking layers LBL1 and LBL2 may have substantially the same size as the window black matrix WBM. In another exemplary embodiment one of the first light blocking layer LBL1 and the second light blocking layer LBL2 may have substantially the same size as the window black matrix WBM, and the other of the first light blocking layer LBL1 and the second light blocking layer LBL2 may have a smaller size than that of the window black matrix WBM.

In an exemplary embodiment, an anti-glare layer may be disposed adjacent to one of the first and second light blocking layers LBL1 and LBL2.

In another exemplary embodiment, the electronic device EA may include an anti-glare layer on the lower surface of the functional layer FL.

Figure 9:
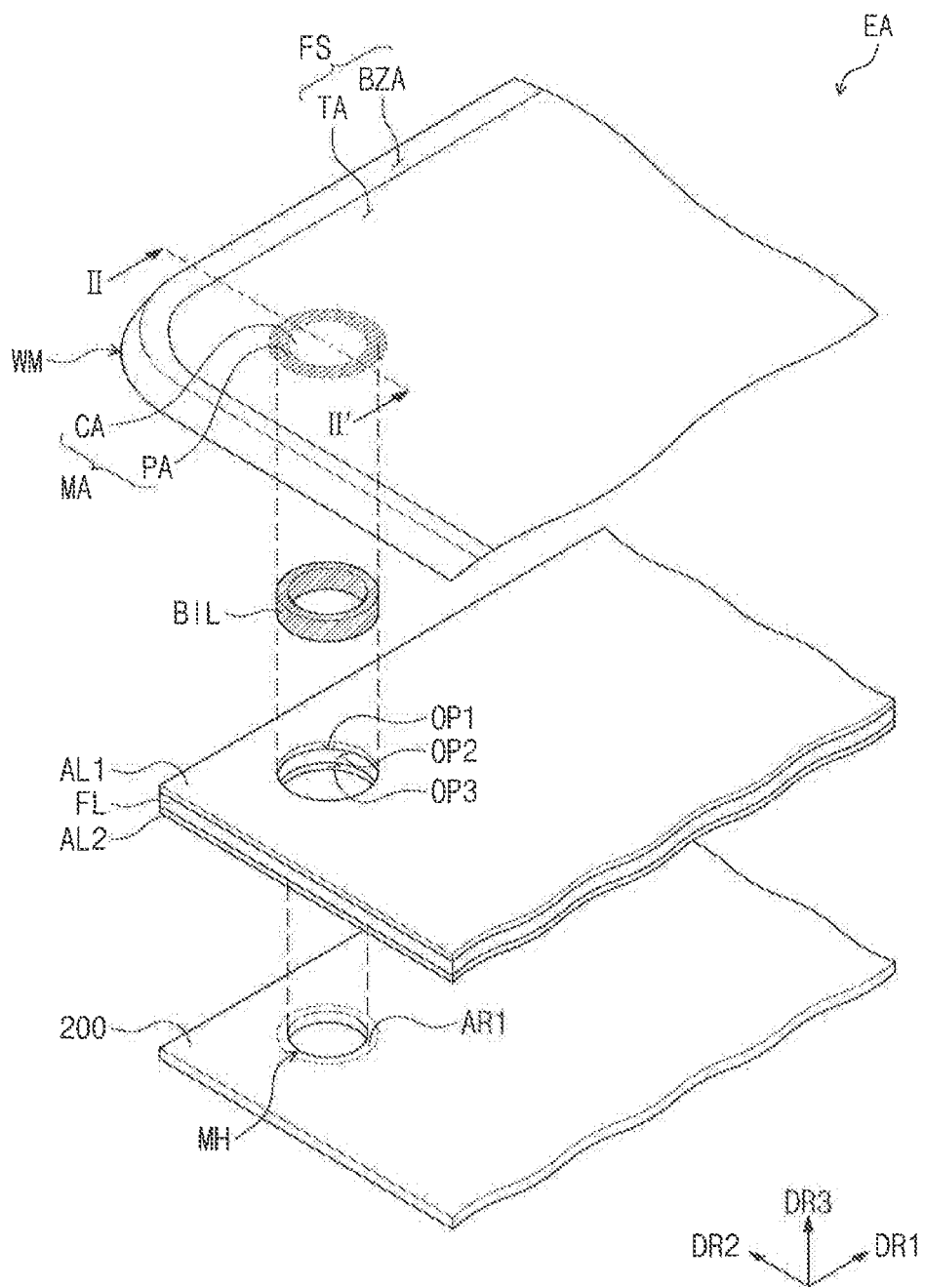
FIG. 9 is an exploded enlarged perspective view showing a module area and a module hole of an electronic device according to another exemplary embodiment of the present disclosure.
Figure 10:
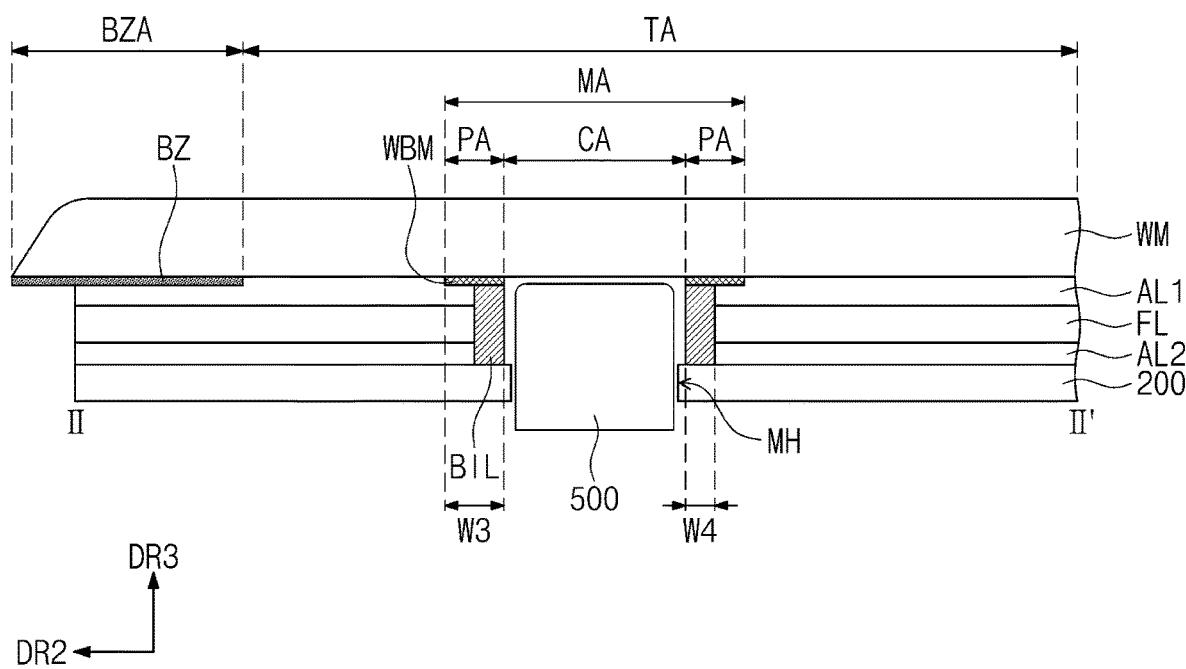
FIG. 10 is a cross-sectional view taken along a line II-II' of FIG. 9.

FIG. 9 is an exploded perspective view showing a module area of an electronic device according to another exemplary embodiment of the present disclosure, and FIG. 10 is a cross-sectional view taken along a line II-II' shown in FIG. 9.

Referring to FIGS. 9-10, the window WM may further include a window black matrix WBM disposed in the module area MA. The window black matrix WBM may be printed on a rear surface (e.g., the bottom surface in the third direction DR3) of the window WM in the peripheral area PA. The window black matrix WBM may be printed to have a color with a high light shielding property. The window black matrix WBM may be any material having a high light shielding property.

A second adhesive layer AL2, a functional layer FL, and a first adhesive layer AL1 may be sequentially stacked in the third direction DR3 between the window WM and the display module 200. A first opening OP1 is defined through the first adhesive layer AL1 to overlap the module hole MH, a second opening OP2 is defined through the functional layer FL, and a third opening OP3 is defined through the second adhesive layer AL2. The first to third openings OP1 to OP3 have a size (e.g., a length in the first direction DR1 and/or second direction DR2) greater than that of the module hole MH. For example, a diameter of the first to third openings OP1 to OP3 is greater than a diameter of the module hole MH. The first to third openings OP1 to OP3 overlap with the peripheral area PA of the module area MA (e.g., in the third direction DR3). The first to third openings OP1 to OP3 provide a space, in which the electronic module 500 is disposed, together with the module hole MH of the display module 200.

A light blocking layer BIL may be disposed inside the first to third openings OP1 to OP3. The light blocking layer BIL may overlap (e.g., in the third direction DR3) with the peripheral area PA of the module area MA. As an example, in an exemplary embodiment, the light blocking layer BIL may be formed on an upper surface of the display module 200 exposed through the first to third openings OP1 to OP3 by an inkjet method. The light blocking layer BIL may include an organic mixture containing a black dye or pigment. The light blocking layer BIL and the window black matrix WBM may have a circular ring shape, and the light blocking layer BIL may have a size smaller than that of the window black matrix WBM. For example, a width W4 in the second direction DR2 of the light blocking layer BIL may be smaller than a width W3 in the second direction DR2 of the window black matrix WBM.

In the exemplary embodiment shown in FIGS. 9-10, the light blocking layer BIL has a size (e.g., diameter in the first direction DR1 and/or second direction DR2) that is smaller than the size of the window black matrix WBM. However, exemplary embodiments of the present disclosure are not limited thereto. For example, the light blocking layer BIL may have substantially the same size as the window black matrix WBM. In certain embodiments, the light blocking layer BIL may have a size that is greater than the size of the window black matrix WBM.

The light blocking layer BIL may be formed on the first area AR1 defined around the module hole MH of the display module 200. In an exemplary embodiment, the light blocking layer BIL may be formed by spraying an ink on the upper surface of the display module 200 in a state in which the functional layer FL is attached on the upper surface of the display module 200 by the second adhesive layer AL2. In another exemplary embodiment, the light blocking layer BIL may be formed by spraying the ink on the upper surface of the display module 200 to correspond to the first area AR1 of the display module 200, and then the functional layer FL may be subsequently attached to the display module 200 by the second adhesive layer AL2.

The light blocking layer BIL is disposed within the first to third openings OP1 to OP3 and is between the window black matrix WBM and the display module 200. As shown in FIG. 9, the light blocking layer BIL is formed to overlap (e.g., in the third direction DR3) with the peripheral area PA of the module area MA. For example, the light blocking layer BIL may overlap with the first area AR1 of the display module 200. Therefore, a light leakage phenomenon in which the light leaks from the first area AR1 may be prevented. Since the light blocking layer BIL extends within the inner areas of the first to third openings OP1 to OP3, the light blocking layer BIL has a thickness greater than that of the light blocking layers LBL1 and LBL2 shown in FIG. 8 in the third direction DR3. Therefore, the light blocking layer BIL may have a higher light blocking performance than the light blocking layers LBL1 and LBL2 shown in FIG. 8, and as a result, there may be a greater reduction in light leakage.

Figure 11:
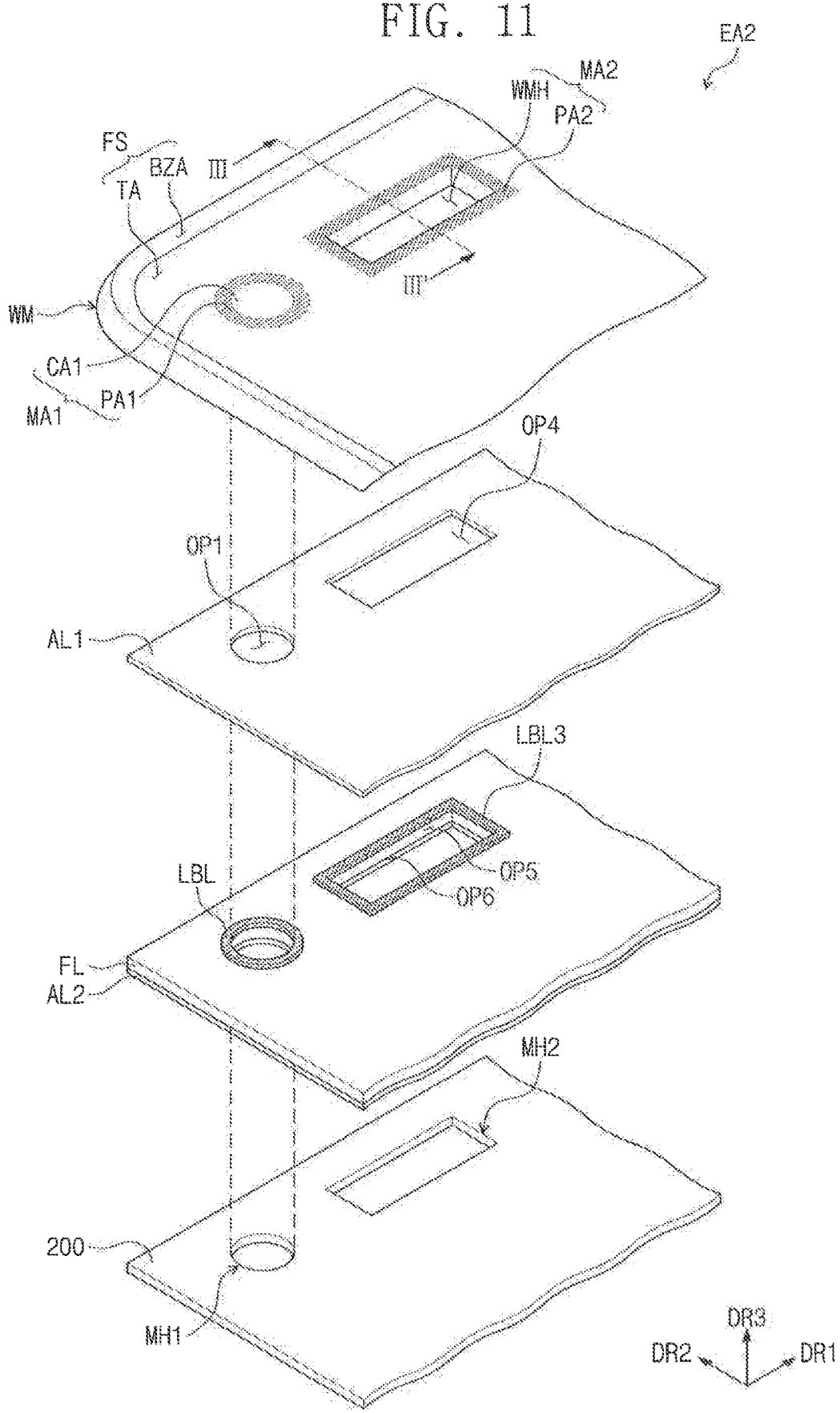
FIG. 11 is an exploded enlarged perspective view showing a module area of an electronic device according to another exemplary embodiment of the present disclosure.
Figure 12:
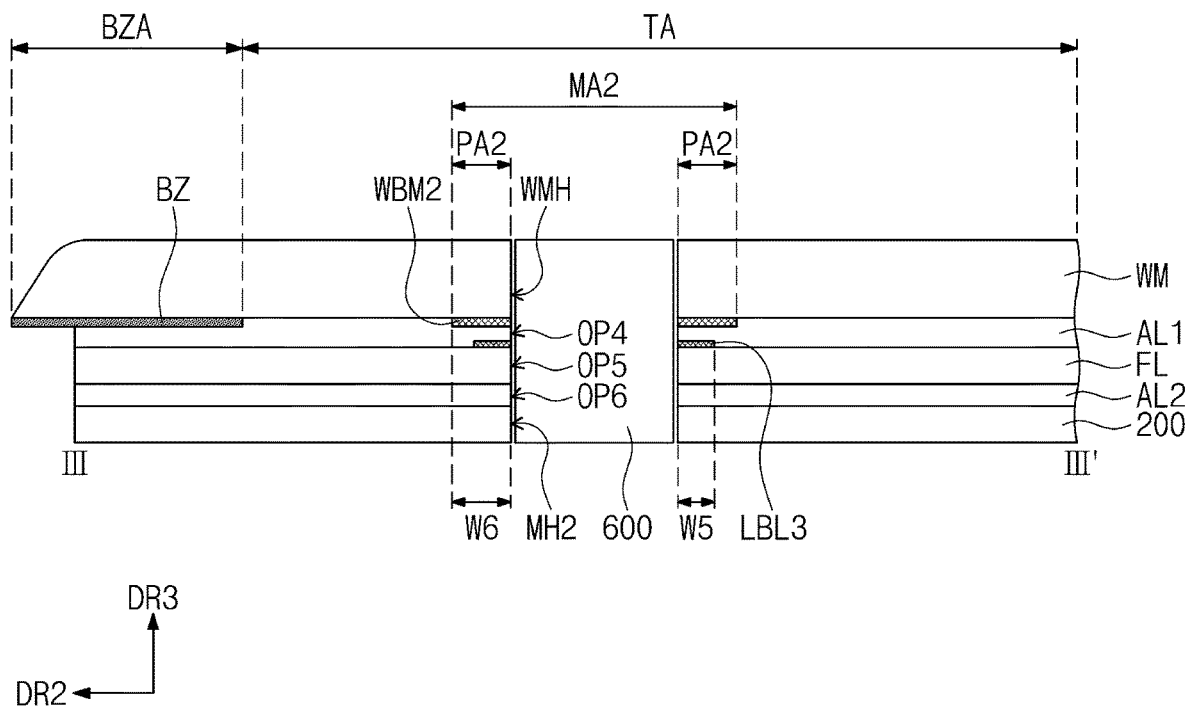
FIG. 12 is a cross-sectional view taken along line III-III' of FIG. 11.

FIG. 11 is an exploded perspective view showing a module area of an electronic device EA2 according to another exemplary embodiment of the present disclosure, and FIG. 12 is a cross-sectional view taken along a line III-III' shown in FIG. 11.

Referring to FIGS. 11 and 12, a window WM may include a first module area MA1 and a second module area MA2 in the electronic device EA2 according to another exemplary embodiment of the present disclosure. The first module area MA1 of the electronic device EA2 has substantially the same structure as the module area MA shown in FIGS. 6 to 10, and thus details thereof will be omitted.

The electronic device EA2 may further include a second window black matrix WBM2 disposed in the second module area MA2. The second module area MA2 may include a window module hole WMH overlapping (e.g., in the third direction DR3) a second module hole MH2 disposed in the display module 200 and a peripheral area PA2. The second window black matrix WBM2 may be printed on a rear surface of the window WM (e.g., the bottom surface of the window WM in the third direction DR3) in the peripheral area PA2. The second window black matrix WBM2 may be printed to have a color with a high light shielding property. For example, the second window black matrix WBM2 may include an organic mixture containing a black pigment or dye. However, the second window black matrix WBM2 may be any material having a high light shielding property.

A second adhesive layer AL2, a functional layer FL, and a first adhesive layer AL1 may be sequentially stacked in the third direction DR3 between the window WM and the display module 200. A fourth opening OP4 is defined through the first adhesive layer AL1, a fifth opening OP5 is defined through the functional layer FL, and a sixth opening OP6 is defined through the second adhesive layer AL2. The fourth to sixth openings OP4 to OP6 may overlap the second module hole MH2 (e.g., in the third direction DR3). The fourth to sixth openings OP4 to OP6 have substantially the same size as the second module hole MH2 and the window module hole WMH. For example, a diameter (e.g., in a plane defined in the first direction DR1 and/or second direction DR2) of the fourth to sixth openings OP4 to OP6 is substantially the same as a diameter of the second module hole MH2. The fourth to sixth openings OP4 to OP6 provide a space, in which an electronic module 600 is disposed, together with the second module hole MH2 and the window module hole WMH. In the present exemplary embodiment, the electronic module 600 disposed in the second module area MA2 is an electronic module of a different type from the electronic module 500 disposed in the first module area MA1. For example, the electronic module 600 may be the audio output module AOM (refer to FIG. 2) that is required to be exposed to the outside through the window module hole WMH. However, exemplary embodiments of the present disclosure are not limited thereto.

A third light blocking layer LBL3 may be disposed around the fourth opening OP4. The third light blocking layer LBL3 may overlap (e.g., in the third direction DR3) with the peripheral area PA2 of the second module area MA2. As an example, the third light blocking layer LBL3 may be a black matrix layer formed on an upper surface of the functional layer FL by a printing, depositing, or coating method. The third light blocking layer LBL3 may include an organic material or a metal material having the light blocking property. The third light blocking layer LBL3 and the second window black matrix WBM2 may have a circular ring shape, and the third light blocking layer LBL3 may have a size (e.g., a diameter in the first direction DR1 and/or second direction DR2) smaller than the size of the second window black matrix WBM2. For example, a width W5 in the second direction DR2 of the third light blocking layer LBL3 may be smaller than a width W6 in the second direction DR2 of the second window black matrix WBM2.

In the present disclosure, a structure in which the third light blocking layer LBL3 has the size smaller than that of the second window black matrix WBM2 is shown as a representative example. However, exemplary embodiments of the present disclosure are not limited thereto. For example, the third light blocking layer LBL3 may have substantially the same size as the second window black matrix WBM2 or may have a greater size than the second window black matrix WBM2.

The second module hole MH2 may be formed through the display module 200. The second module hole MH2 may overlap (e.g., in the third direction DR3) with the fourth to sixth openings OP4 to OP6 and may overlap with the window module hole WMH of the second module area MA2. The electronic module 600 may be disposed in spaces formed by the second module hole MH2, the fourth to sixth openings OP4 to OP6 and the window module hole WMH. Accordingly, the electronic module 600 may be inserted into the space and may be stably fixed therein.

In another exemplary embodiment, the fourth to sixth openings OP4 to OP6 may have a diameter which accommodates a light blocking layer (e.g., a circular ring shape light blocking layer). The light blocking layer is disposed in the inner space of the fourth to sixth openings OP4 to OP6 and extends in the third direction DR3 from the fourth to sixth openings OP4 to OP6. The electronic module 600 is disposed in the inner space defined by the light blocking layer.

Figure 13:
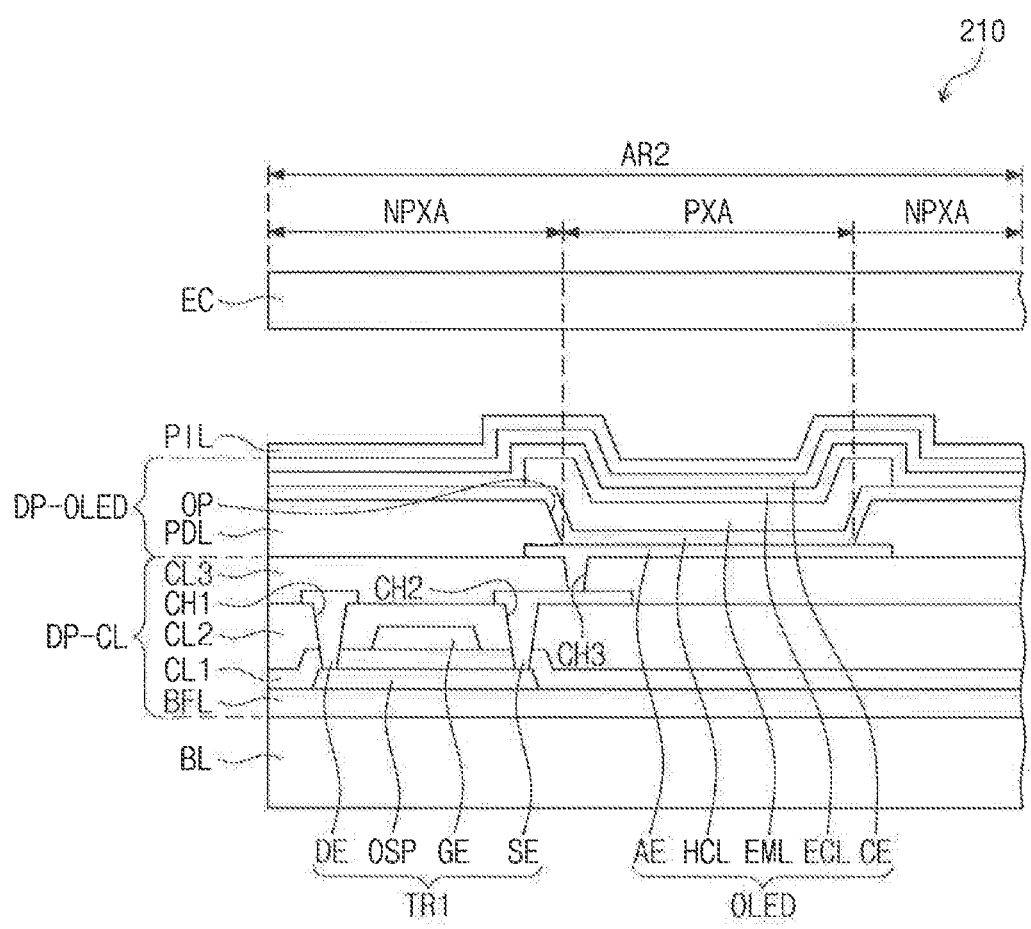
FIG. 13 is a cross-sectional view showing an active area of a display panel according to an exemplary embodiment of the present disclosure.
Figure 14:
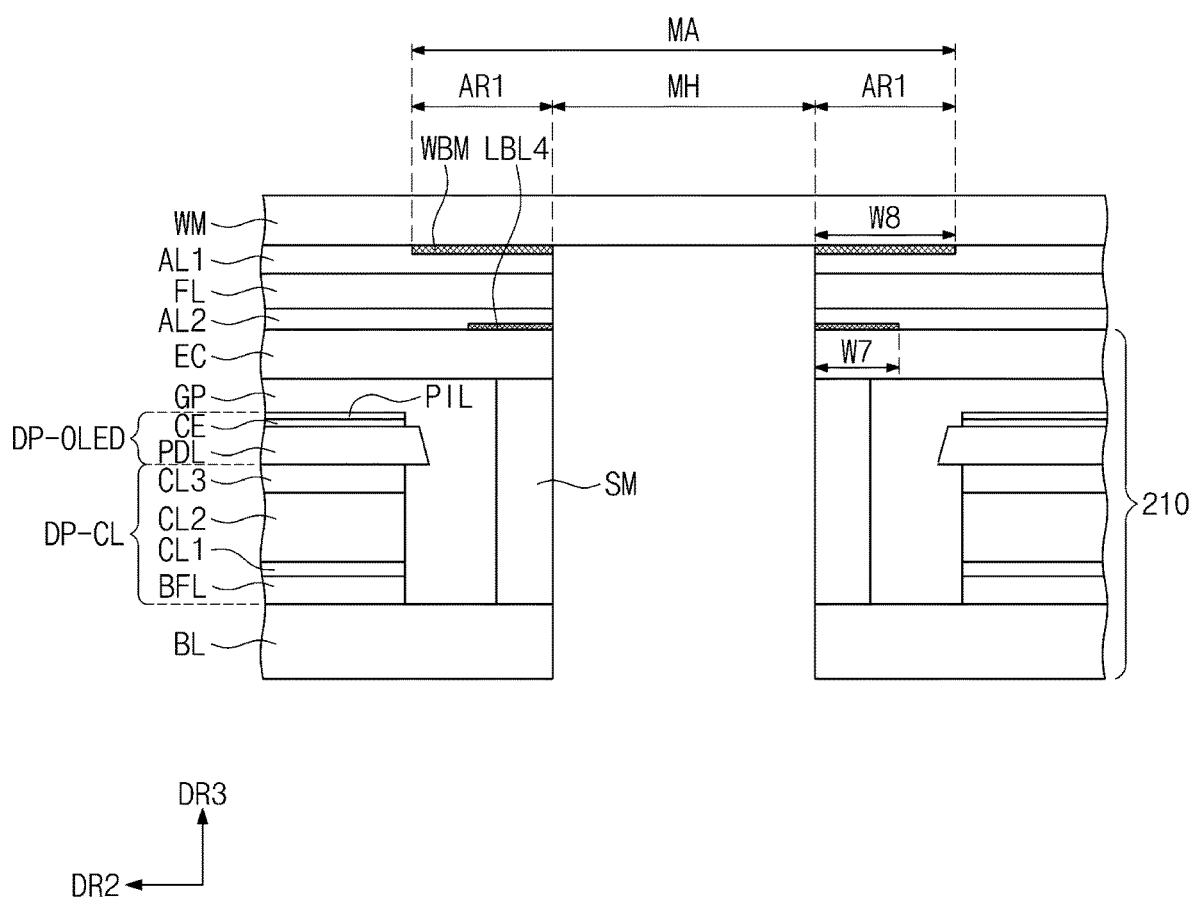
FIG. 14 is a cross-sectional view showing a module area of an electronic device according to an exemplary embodiment of the present disclosure.

FIG. 13 is a cross-sectional view showing an active area of a display panel 210 according to an exemplary embodiment of the present disclosure, and FIG. 14 is a cross-sectional view showing a module area of an electronic device according to an exemplary embodiment of the present disclosure.

Referring to FIGS. 13 and 14, the display panel 210 includes a base layer BL, a circuit device layer DP-CL disposed on the base layer BL, a display device layer DP-OLED disposed on the circuit device layer DP-CL, an encapsulation substrate EC, and a sealing member SM.

The base layer BL may include a glass substrate. The base layer BL may include a substrate having a constant refractive index in a visible light wavelength range.

The circuit device layer DP-CL may include a buffer layer BFL, a first intermediate inorganic layer CL1, and a second intermediate inorganic layer CL2, which are inorganic layers, and an intermediate organic layer CL3 that is an organic layer. FIG. 13 shows an arrangement relation of a semiconductor pattern OSP, a control electrode GE, an input electrode DE, and an output electrode SE, which form a first transistor TR1. The circuit device layer DP-CL may further include at least one contact hole. For example, first and second contact holes CH1 and CH2 are shown in the representative example of FIG. 13.

The display device layer DP-OLED includes a light emitting device OLED. The display device layer DP-OLED includes organic light emitting diodes as the light emitting device OLED. The display device layer DP-OLED includes a pixel definition layer PDL, e.g., an organic material.

A first electrode AE is disposed on the intermediate organic layer CL3. The first electrode AE is connected to the output electrode SE through a third contact hole CH3 defined through the intermediate organic layer CL3. An opening OP is defined through the pixel definition layer PDL. At least a portion of the first electrode AE is exposed through the opening OP of the pixel definition layer PDL. The opening OP of the pixel definition layer PDL is referred to as a "light emitting opening" to distinguish it from other openings.

A display area AR2 of the display panel 210 may include a light emitting area PXA and a non-light emitting area NPXA defined adjacent to the light emitting area PXA. The non-light emitting area NPXA may surround the light emitting area PXA. In the present exemplary embodiment, the light emitting area PXA is defined to correspond to a portion of the first electrode AE exposed through the light emitting opening OP.

A hole control layer HCL may be commonly disposed on the light emitting area PXA and the non-light emitting area NPXA. The hole control layer HCL may include a hole transport layer and may further include a hole injection layer. A light emitting layer EML may be disposed on the hole control layer HCL. The light emitting layer EML may be disposed in an area corresponding to the light emitting opening OP. The light emitting layer EML may be formed in each of the pixels after being divided into plural portions. The light emitting layer EML may include an organic material and/or an inorganic material. The light emitting layer EML may generate a predetermined color light.

An electron control layer ECL may be disposed on the light emitting layer EML. The electron control layer ECL may include an electron transport layer and may further include an electron injection layer. The hole control layer HCL and the electron control layer ECL may be commonly formed in a plurality of the pixels using an open mask. A second electrode CE may be disposed on the electron control layer ECL. The second electrode CE may be commonly disposed in a plurality of the pixels.

A protective layer PIL may be further disposed on the display device layer DP-OLED. The protective layer PIL may protect the second electrode CE of the light emitting devices OLED. The protective layer PIL may include an inorganic material, such as silicon oxide, silicon nitride, silicon oxynitride, etc.

The encapsulation substrate EC may be disposed on the second electrode CE. The encapsulation substrate EC and the second electrode CE may be spaced apart from each other (e.g., in the third direction DR3). A gap GP between the encapsulation substrate EC and the second electrode CE may be filled by air or inert gas. In addition, the gap GP may be filled with a filler, such as a silicone-based polymer, an epoxy-based resin, an acrylic-based resin, etc.

The encapsulation substrate EC may be transparent. The encapsulation substrate EC may include a glass substrate. The encapsulation substrate EC may include a substrate having a constant refractive index in a visible light wavelength range.

The stack structure of the base layer BL, the circuit device layer DP-CL, and the display device layer DP-OLED may be defined as a lower display substrate. The sealing member SM may couple the lower display substrate and the encapsulation substrate EC. The sealing member SM may extend along an edge of the encapsulation substrate EC. The sealing member SM may overlap (e.g., in the third direction DR3) with the non-active area NAA (refer to FIG. 3) of the display panel 210.

As shown in FIG. 14, the sealing member SM may overlap with the non-display area AR1 of the display panel 210. The pixel is not formed in the non-display area AR1 of the display panel 210. The non-display area AR1 of the display panel 210 may overlap with the module area MA of the electronic device EA shown in FIG. 1A.

The encapsulation substrate EC and the sealing member SM may prevent moisture from entering the lower display substrate. In the exemplary embodiment of the present disclosure, the sealing member SM may couple an upper surface (e.g., in the third direction DR3) of the base layer BL and a lower surface of the encapsulation substrate EC to each other.

In an exemplary embodiment, the sealing member SM may include an inorganic adhesive member such as a frit. However, in other exemplary embodiments, the sealing member SM may include an organic adhesive member. In the present exemplary embodiment, since the display panel 210 is completely sealed from the outside, a strength of the display panel 210 may be improved, and defects of the light emitting device OLED may be prevented.

The display module 200 may further include a fourth light blocking layer LBL4 disposed on the upper surface of the display panel 210 to correspond to the first area AR1 defined around the module hole MH. For example, the fourth light blocking layer LBL4 may be disposed on the upper surface of the encapsulation substrate EC. As an example, the fourth light blocking layer LBL4 may be a black matrix layer formed on the upper surface of the encapsulation substrate EC by a printing, depositing, or coating method. The fourth light blocking layer LBL4 may include an organic material or a metal material having the light blocking property. The fourth light blocking layer LBL4 and the window black matrix WBM may have a circular ring shape, and the fourth light blocking layer LBL4 may have a size (e.g., a diameter in the first direction DR1 and/or second direction DR2) that is smaller than that of the window black matrix WBM. For example, a width W7 in the second direction DR2 of the fourth light blocking layer LBL4 may be smaller than a width W8 in the second direction DR2 of the window black matrix WBM.

In the present exemplary embodiment, the fourth light blocking layer LBL4 has a size that is smaller than that of the window black matrix WBM. However, exemplary embodiments of the present disclosure are not limited thereto. For example, the fourth light blocking layer LBL4 may have substantially the same size as the window black matrix WBM.

As shown in FIG. 14, when the display module 200 includes the fourth light blocking layer LBL4, the light blocking layers LBL1 and LBL2 (refer to FIG. 8) may not be disposed on at least one surface of the upper and lower surfaces of the functional layer FL. However, in another exemplary embodiment, the electronic device may include both a fourth light blocking layer LBL4 and at least one of light blocking layers LBL1 and LBL2.

The fourth light blocking layer LBL4 may be formed to overlap with the peripheral area of the module hole MH, such as the first area AR1, to prevent light leakage from the first area AR1.

Figure 15:
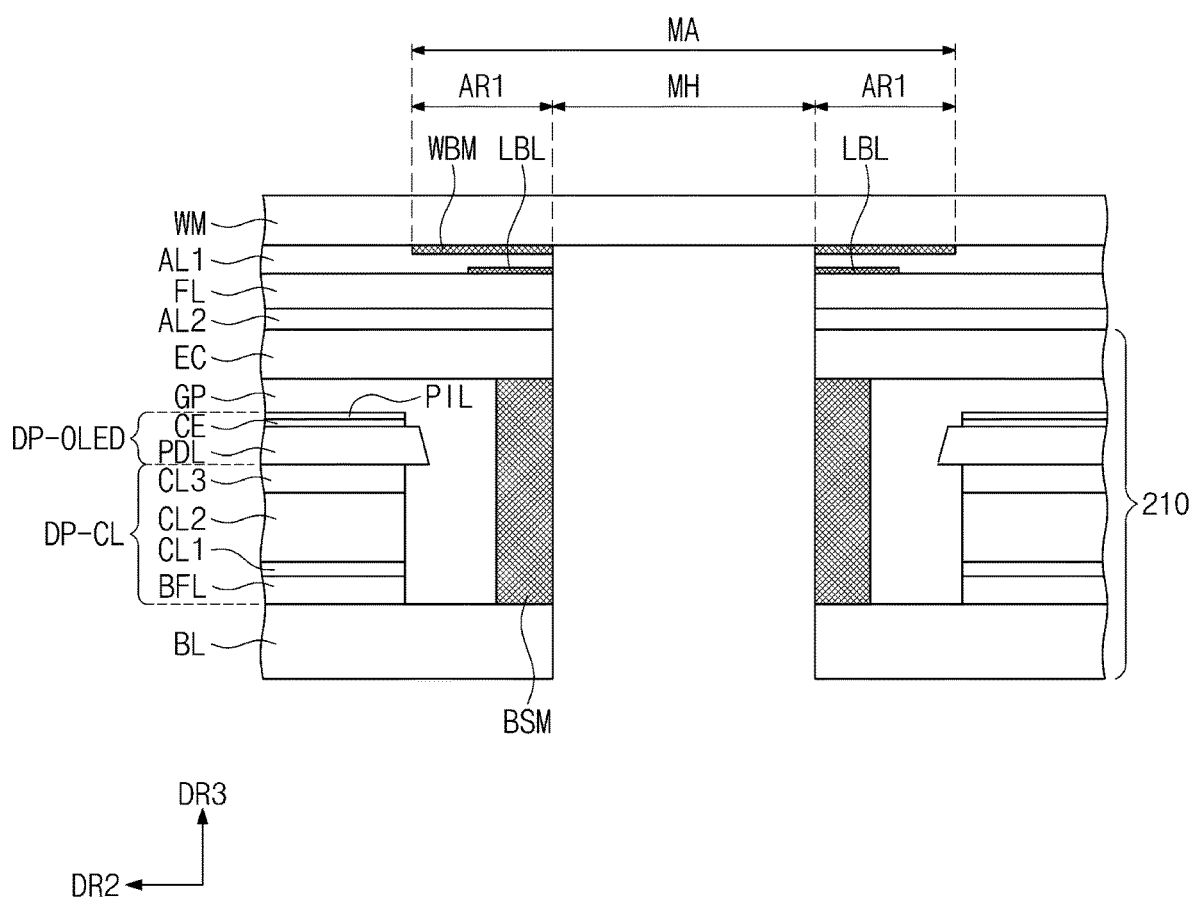
FIG. 15 is a cross-sectional view showing a module area of an electronic device according to another exemplary embodiment of the present disclosure.

FIG. 15 is a cross-sectional view showing a module area of an electronic device according to another exemplary embodiment of the present disclosure.

Referring to FIG. 15, a display panel 210 may include a light blocking sealing member BSM overlapping (e.g., in the third direction DR3) with the non-display area AR1 of the display panel 210. The light blocking sealing member BSM may be a sealing member having a light blocking property. The light blocking sealing member BSM may include an adhesive member and an organic mixture containing a black dye or pigment.

In an exemplary embodiment, the light blocking sealing member BSM may overlap with the non-active area NAA (refer to FIG. 3) of the display panel 210. The light blocking sealing member BSM may extend from an upper surface of the base layer BL to a lower surface of the encapsulation substrate EC. However, in another exemplary embodiment, the light blocking sealing member BSM may be disposed in the non-display area AR1 of the display panel 210, and the sealing member SM shown in FIG. 14 may be disposed in the non-active area NAA.

As shown in FIG. 15, a light blocking layer LBL may be disposed on an upper surface of the functional layer FL. However, exemplary embodiments of the present disclosure are not limited thereto. For example, in an exemplary embodiment in which the light blocking sealing member BSM is included in the display panel 210, the electronic device EA may include the first and second light blocking layers LBL1 and LBL2 (refer to FIG. 8) respectively disposed on the upper and lower surfaces of the functional layer FL and the light blocking layer BIL (refer to FIGS. 9 and 10) sprayed on the upper surface of the display module 200.

Accordingly, the light blocking sealing member BSM may prevent the leakage of light passing through the module hole MH from the first area AR1 defined around the module hole MH. In addition, since the leaked light is blocked again by the window black matrix WBM and the light blocking layer LBL, the phenomenon in which the light leaked from the first area AR1 of the module hole MH is viewed from the outside by the user may be prevented.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein.

What is claimed is:

1. An electronic device comprising:
a display module having an active area in which pixels are disposed and a non-active area, in which pixels are not disposed, adjacent to the active area, the active area including a module hole;
a window disposed on the display module;
a light shielding layer disposed on an upper surface or a lower surface of a module area of the window, the module area overlapping a region of the display module adjacent to the module hole;
a light blocking layer below the light shielding layer and overlapping the module area; and
an electronic module disposed to be inserted into an opening formed by the module hole,
wherein the light blocking layer and a side surface of the electronic module located in the module hole are spaced apart from each other in a direction parallel to an upper surface of the display module.

2. The electronic device of claim 1, further comprising:
a first adhesive layer disposed between the display module and the window, the first adhesive layer including a first opening defined therethrough that overlaps with the module hole;
a functional layer disposed between the display module and the window, the functional layer including a second opening defined therethrough that overlaps with the module hole; and
a second adhesive layer disposed between the functional layer and the display module, the second adhesive layer including a third opening defined therethrough that overlaps with the module hole;
wherein the electronic module is disposed in an opening formed by at least one of the module hole, the first opening, the second opening and the third opening.

3. The electronic device of claim 2, wherein the first, second, and third openings have a size greater than the module hole or a size that is substantially the same as the module hole, and the light blocking layer is disposed in inner areas of the first, second, and third openings.

4. The electronic device of claim 3, wherein the light blocking layer comprises an organic mixture comprising a black dye or pigment.

5. The electronic device of claim 1, wherein the light shielding layer has a width that is greater than a width of the light blocking layer.

6. The electronic device of claim 1, wherein the active area comprises:
a first area adjacent to the module hole; and
a second area surrounding the first area, wherein the at least one pixel is not disposed in the first area, and the at least one pixel is disposed in the second area.

7. The electronic device of claim 6, wherein the light blocking layer overlaps with the first area.

8. The electronic device of claim 1, wherein the light blocking layer has a lowermost surface directly contacting the upper surface of the display module.

9. A display device comprising:
a display module having a first area in which pixels are disposed, a second area including a first opening and a third area disposed between the first area and the second area;
a functional layer disposed on the display module, the functional layer including a second opening overlapping with the first opening and a first inner side surface defining the second opening;
a window disposed on the functional layer and including a first surface and the second surface;
a light shielding layer disposed on the first surface or the second surface of the window;
a first adhesive layer disposed between the display module and the window, the first adhesive layer including a third opening overlapping with the first opening and a second inner side surface defining the third opening;
a second adhesive layer disposed between the functional layer and the display module, the second adhesive layer including a fourth opening overlapping with the first opening and a third inner side surface defining the fourth opening; and
a light blocking layer disposed on at least one the first to third inner side surfaces,
wherein the second, third and fourth openings have a size greater than the first opening.

10. The display device of claim 9, wherein the light blocking layer comprises an organic mixture comprising a black dye or pigment.

11. The display device of claim 9, wherein the light blocking layer contacts the light shielding layer.

12. The display device of claim 9, wherein the light shielding layer overlaps with at least portion of the third area.

13. The display device of claim 12, wherein the light shielding layer surrounds at least portion of the first opening.

14. The electronic device of claim 9, wherein the light blocking layer has a lowermost surface directly contacting an upper surface of the display module.

15. An electronic device comprising:
- a display module having a first area in which pixels are disposed, a second area including a first opening and a third area disposed between the first area and the second area;
- a functional layer disposed on the display module, the functional layer including a second opening overlapping with the first opening and a first inner side surface defining the second opening;
- a window disposed on the functional layer and including a first surface and the second surface;
- a light shielding layer disposed on the first surface or the second surface of the window;
- a first adhesive layer disposed between the display module and the window, the first adhesive layer including a third opening overlapping with the first opening and a second inner side surface defining the third opening;
- a second adhesive layer disposed between the functional layer and the display module, the second adhesive layer including a fourth opening overlapping with the first opening and a third inner side surface defining the fourth opening; and
- a light blocking layer disposed on at least one the first to third inner side surfaces;
- an electronic module disposed to be inserted into the first opening formed by the module hole; and
- a housing coupled to the window,
- wherein the light blocking layer is disposed between at least one of the first to third inner side surfaces and a side surface of the electronic module located in the first opening.

16. The electronic device of claim 15, further comprising:
an electronic module overlapping at least portion of the first opening.

17. The electronic device of claim 15, wherein the light blocking layer has a lowermost surface directly contacting an upper surface of the display module.

\* \* \* \* \*